(12) United States Patent
Kushta et al.

(10) Patent No.: US 8,013,685 B2
(45) Date of Patent: Sep. 6, 2011

(54) BROADBAND TRANSITION FROM A VIA INTERCONNECTION TO A PLANAR TRANSMISSION LINE IN A MULTILAYER SUBSTRATE

(75) Inventors: Taras Kushta, Tokyo (JP); Kaoru Narita, Tokyo (JP); Tomoyuki Kaneko, Tokyo (JP); Shin-ichi Ogou, Kanagawa (JP)

(73) Assignees: Renesas Electronics Corporation, Kanagawa (JP); NEC Corporation, Tokyo (JP)

( * ) Notice: Subject to any disclaimer, the term of this patent is extended or adjusted under 35 U.S.C. 154(b) by 186 days.

(21) Appl. No.: 12/281,460

(22) PCT Filed: Mar. 2, 2007

(86) PCT No.: PCT/JP2007/054621
§ 371 (c)(1),
(2), (4) Date: Sep. 2, 2008

(87) PCT Pub. No.: WO2007/102597
PCT Pub. Date: Sep. 13, 2007

(65) Prior Publication Data
US 2009/0015345 A1    Jan. 15, 2009

(30) Foreign Application Priority Data

Mar. 3, 2006    (JP) .................................. 2006-058676

(51) Int. Cl.
*H03H 7/38* (2006.01)
(52) U.S. Cl. ............................................. 333/33; 333/34

(58) Field of Classification Search ..................... 333/33, 333/34, 238, 246; 174/250
See application file for complete search history.

(56) References Cited

U.S. PATENT DOCUMENTS 7,492,146 B2 * 2/2009 Behziz ........................ 324/158.1
2006/0197625 A1 * 9/2006 Kashiwakura .................. 333/33

FOREIGN PATENT DOCUMENTS

| JP | 05-102667 A | 4/1993 |
| JP | 05-199019 A | 8/1993 |
| JP | 06-302964 A | 10/1994 |
| JP | 08-250912 A | 9/1996 |
| JP | 2003-031945 A | 1/2003 |
| JP | 2003-218481 A | 7/2003 |
| JP | 2004-363276 A | 12/2004 |
| JP | 2004-363975 A | 12/2004 |
| JP | 2006-245291 A | 9/2006 |
| WO | 01/67538 A1 | 9/2001 |

* cited by examiner

*Primary Examiner* — Stephen E Jones
(74) *Attorney, Agent, or Firm* — Sughrue Mion, PLLC

(57) ABSTRACT

According to one embodiment, a broadband transition to joint a via structure and a planar transmission line in a multilayer substrate is formed as an intermediate connection between the signal via pad and the planar transmission line disposed at the same conductor layer. The transverse dimensions of the transition are equal to the via pad diameter at the one end and strip width at another end; The length of the transition can be equal to the characteristic dimensions of the clearance hole in the direction of the planar transmission line or defined as providing the minimal excess inductive reactance in time-domain according to numerical diagrams obtained by three-dimensional full-wave simulations.

15 Claims, 23 Drawing Sheets

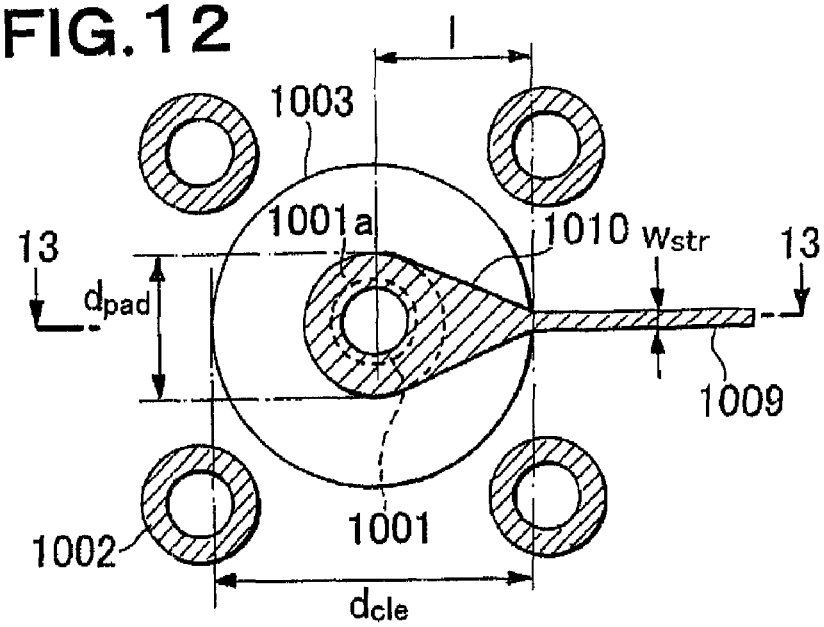
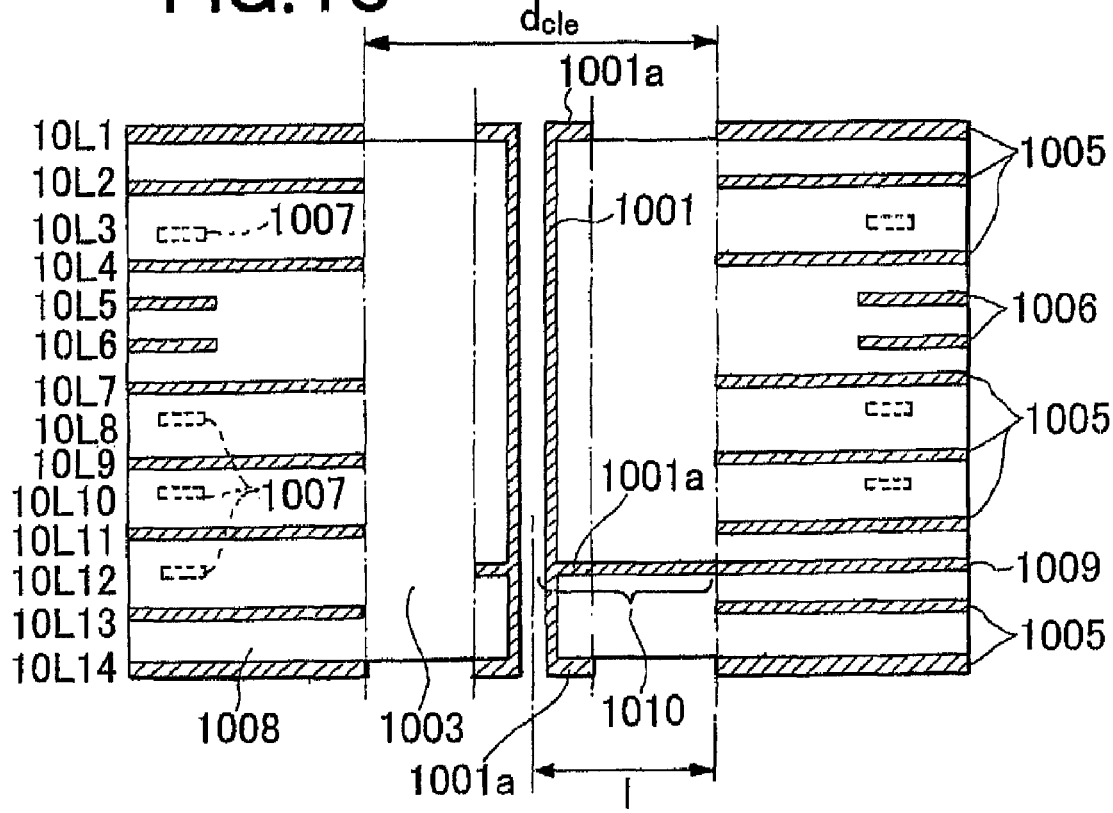

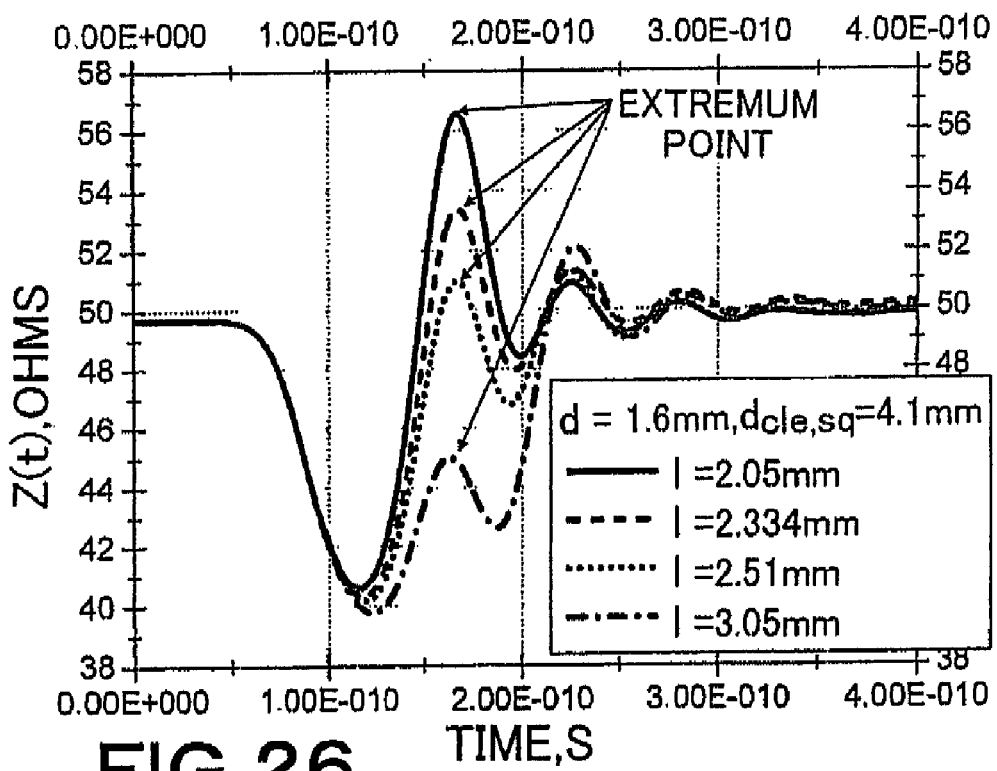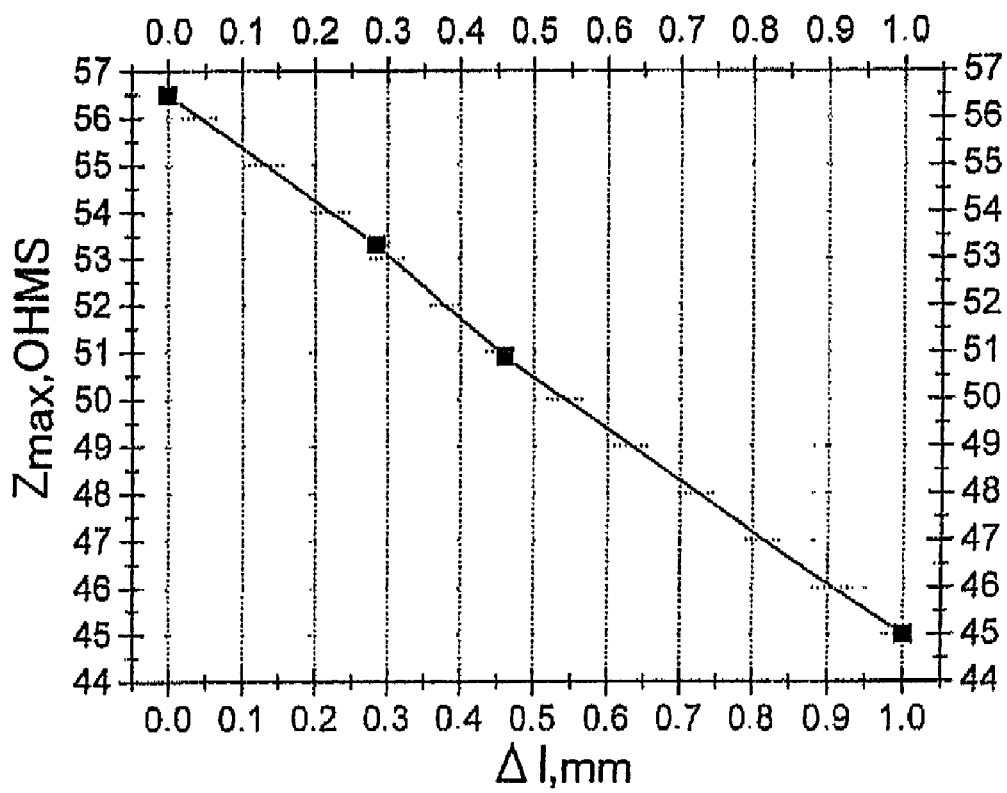

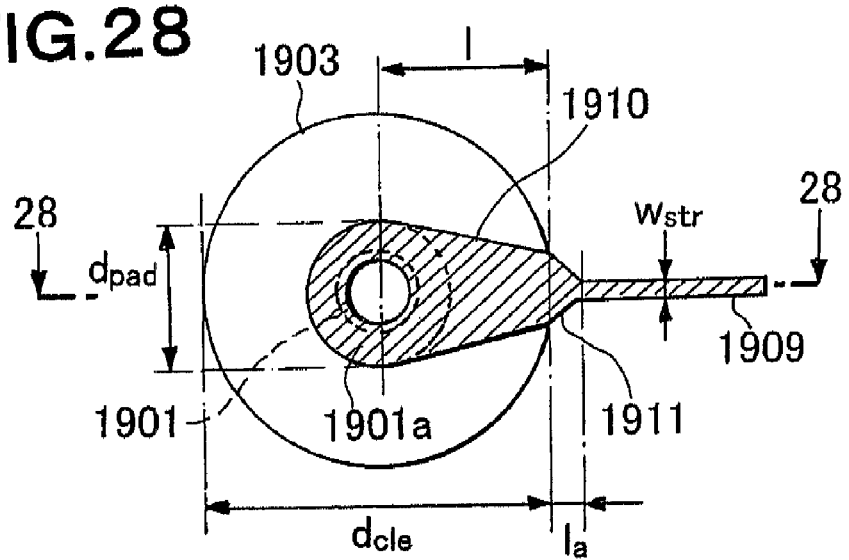
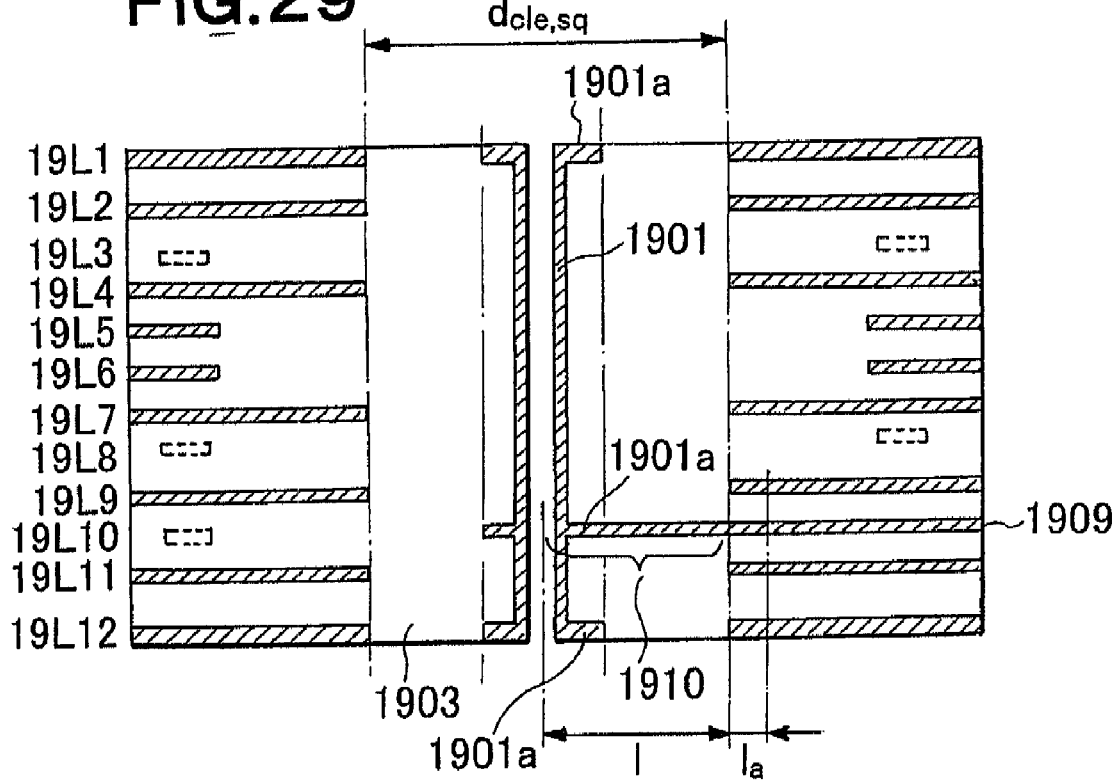

US 8,013,685 B2

BROADBAND TRANSITION FROM A VIA INTERCONNECTION TO A PLANAR TRANSMISSION LINE IN A MULTILAYER SUBSTRATE

TECHNICAL FIELD

This invention relates generally to multilayer substrate technologies and, as more specifically, to a broadband transition from a via pad to a planar transmission line disposed at the same conductor layer of a multilayer substrate.

BACKGROUND ART

Design of high-performance high-speed electrical circuits is one of the most important issues to implement interconnections based on multilayer substrate technologies. As for an example, characteristic impedance mismatch can lead to large return losses that can dramatically degrade transferring high-speed signals at the transceiver. Multilayer substrates, which are cost-effective technologies, include planar conductive layers and vertical transitions connecting planar transmission line circuits disposed at different conductor layers. Vertical transitions in the multilayer substrate are usually realized by means of via structures.

To join a via and a planar transmission line forming an interconnect circuit in a multilayer substrate, a pad fabricated at the same conductor layer as the planar transmission line is usually used. Via pad has dimensions which are larger than via through hole diameter to provide a connection of a via and a planar transmission line. The pad has usually a circular or square form and is directly connected to the planar transmission line. However, such transition from the pad to the planar transmission line can give an increase of the characteristic impedance mismatching at higher frequencies due to the excess inductive reactance of a part of the transmission line disposed at the clearance hole area for which ground planes forming planar transmission lines are absent in the vertical direction. Especially, this problem is important if transverse dimensions of the clearance hole are large enough. This situation can be appeared when high-speed interconnections are designed because cross-sectional form and dimensions of the clearance hole are effective parameters to control the characteristic impedance.

In JP-A-2004-363975, a transition from a signal via pad to a coplanar transmission line interconnection is presented. In this consideration, a transition has also a form of coplanar transmission line having width of the signal strip and distance to the ground planes providing its characteristic impedance match to the coplanar transmission line interconnection. However, such transition is only formed for the coplanar transmission line at same conductor of the substrate and is applied for the square or rectangular clearance hole, that is, for the clearance hole in which the coplanar transmission segment can be formed. Also the width of the strip and distance between strip and ground plates at the same conductor layer must be chosen to provide predetermined characteristic impedance. In some cases, edge coupling between the signal strip of the transition and the coplanar transmission line interconnection in the place of the connection can increase their impedance mismatching.

In JP-A-H8-250912, a taper is used to connect a signal via and stripline. However, the length of the taper is small compared with the characteristic dimension of the clearance hole in the direction of the stripline and cannot effect on the excess reactance of the strip in the area of the clearance hole.

DISCLOSURE OF INVENTION

The cross-sectional form of the clearance hole in a via structure can be large enough compared with via pad dimensions and can take not only circular form but also various shapes (as for example, rectangular, square, elliptical and other complicated shapes) to provide a high electrical performance of the via structure. For this case, methods and structures to provide compensation of the excess reactance of the transmission line conductor in the area of the clearance hole are necessary, especially at higher frequencies.

It is an object of the present invention to provide a high-performance broadband transition from a via pad to a planar transmission line in a multilayer substrate as for an example in a multilayer printed circuit board or a multilayer package.

According to the present invention, there is provided a broadband transition structure for a connection of a via structure to a planar transmission line in a multilayer substrate, the via structure comprising a signal via, comprising: a signal via pad serving for connection of the signal via and the planar transmission line; and a compensating part connected to the signal via pad and the planar transmission line serving for compensation of an excess inductive reactance of a part of the transmission line situated in an area of a clearance hole by means of appropriate choice of form and dimensions of the compensation part.

In the broadband transition structure, the compensating part may have a form of a taper in which transverse dimensions of the taper are equal to a diameter of the signal via at one end and a signal strip width of the planar transmission line at the other end.

In the broadband transition structure, a length of the taper may be equal to a radius of the clearance hole in a direction of the planar transmission line.

In the broadband transition structure, a length of the taper may be longer than a radius of the clearance hole in a direction of the planar transmission line.

In the broadband transition structure, a length of the taper may be equal to a sum of a radius of the clearance hole in a direction of the planar transmission line and surplus providing an additional compensation of the excess inductive reactance by means of an excess capacitance reactance of a part of the taper formed in the planar transmission line, the surplus being connected to the taper formed in an area of the clearance hole at one end and to the planar transmission line at the other end.

In the broadband transition structure, a center line of the taper may be parallel with a center line of the planar transmission line.

In the broadband transition structure, a center line of the taper may be oblique with respect to a center line of the planar transmission line.

In the broadband transition structure, the compensating part may comprise two tapers which have a form and dimensions providing compensation of the excess inductive reactance of the part of signal strip in the area of the clearance hole.

In the broadband transition structure, a total length of two tapers may be equal to a radius of the clearance hole in a direction of the planar transmission line.

In the broadband transition structure, the compensating part may comprise a number of tapers which have a form and dimensions providing compensation of the excess inductive reactance of the part of a signal strip in the area of the clearance hole.

In the broadband transition structure, the compensating part may have a first portion, width of which increases as approaching the planar transmission line, and a second portion, width of which decreases as approaching the planar transmission line.

In the broadband transition structure, the compensating part may have a first portion, width of which is constant, and a second portion, width of which decreases as approaching the planar transmission line.

In the broadband transition structure, the via structure may further comprise ground vias.

In the broadband transition structure, a plurality of sets of the signal via, the signal via pad, the compensation part and the planar transmission line may be provided.

A compensating part connected to the signal via pad and the planar transmission line serves for compensation of an excess inductive reactance of a part of the transmission line situated in an area of a clearance hole by means of appropriate choice of form and dimensions of said compensation part.

BRIEF DESCRIPTION OF DRAWINGS

FIG. 12 is a plan view at the 12th conductor layer of broadband transition from a via structure to a stripline in 14-conductor-layer PCB with compensating part in the form of a linear taper;

FIG. 13 is a cross-sectional view of broadband transition from a via structure to a stripline in a 14-conductor-layer PCB with compensating part in the form of a linear taper;

FIG. 25 shows a characteristic impedance of the test structure with via through hole diameter of 1.6 mm and square clearance hole in time domain with compensating part in the form of linear taper in which small additional capacitance is injected by the increase of the length of the taper;

FIG. 26 shows a magnitude of the characteristic impedance in extremum points shown in FIG. 25 of the test structure with the square clearance hole in time domain versus difference between the length of the taper and half side of the square clearance hole;

FIG. 28 is a plan view at the 10th conductor layer of broadband transition from a single signal via to a stripline in a 12-conductor-layer PCB with the compensating part consisting of two linear tapers: one is in the area of clearance hole; another is in the area of planar transmission line;

FIG. 29 is a cross-sectional view of broadband transition from a single signal via to a stripline with the compensating part in the form of linear taper;

BEST MODE FOR CARRYING OUT THE INVENTION

The following description of the preferred embodiments directed to only several types of transitions from the via pad to the planar transmission line but it is well understood that this description should not be viewed as narrowing the claims which follows.

Figure 1:
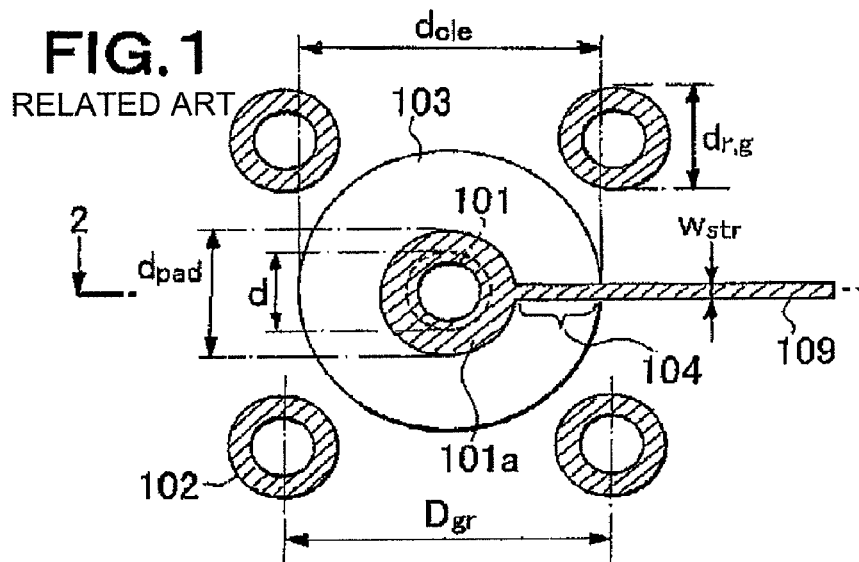
FIG. 1 is a plan view at the 12th conductor layer of prior-art transition from a via structure to a stripline in a 14-conductor-layer PCB.
Figure 2:
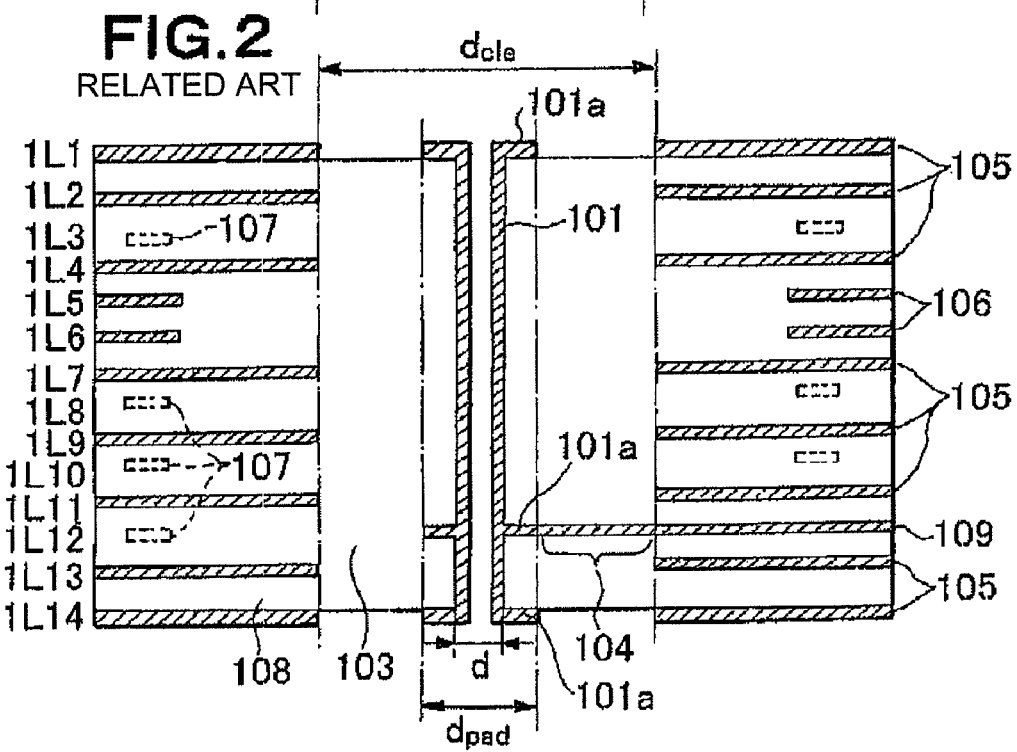
FIG. 2 is a cross-sectional view of prior-art transition from a via structure to a stripline in the 14-conductor-layer PCB.

Referring to the drawings, a via structure in a 14-conductor-layer printed circuit board (PCB), which serve only as an example of via structure and multilayer PCB design, is shown in FIGS. 1 and 2. In these figures, the arrangement of planar conductor layers of the PCB separated by an isolating material 108 is as follows: Ground planes are 1L1, 1L2, 1L4, 1L7, 1L9, 1L11, 1L13 and 1L14 layers; Power supplying planes are 1L5 and 1L6 layers; and signal planes are 1L3, 1L8, 1L10, and 1L12 layers. The via structure consists of a signal via 101, four ground vias 102 which are connected to the ground plates 105 and clearance hole 103 which separates the signal via from the planar conductor layers. At the signal layer 1L12, a stripline 109 is connected to the signal via pad 101a by means of strip segment 104, having the width as the stripline 109, formed at the same conductor layer as the pad and the stripline.

Here, we show the electrical performance of the via structure embedded in the 14-conductor layer PCB with following dimensions by means of Time Domain Reflectometry (TDR) data: d=1.6 mm, 1.2 mm or 0.8 mm; dpad=2.2 mm; dcle=4.1 mm; dr,g=1.75 mm; and Dgr=5.08 mm. Note the 14-conductor-layer PCB comprises fourteen copper planar conductor layers isolated by the FR-4 material with the relative permittivity of er=4.2 as assumed in simulations. Spaces between planar conductor layers (see FIG. 3) are: H1=0.2 mm, H2=0.385 mm, H3=0.2 mm, H4=0.5 mm and H5=0.15 mm; the thickness of conductor planes embedded in the PCB is 0.035 mm; the thickness of top and bottom conductor planes is 0.055 mm. The signal via of the model is connected to a stripline disposed at the 12th conductor layer of the PCB by means of the pad having the same diameter as via pads at top and bottom conductor layers. The width of the stripline is wstr=0.11 mm to provide the characteristic impedance of about 50 Ohms.

In our case, TDR data are obtained using a three-dimensional full-wave electromagnetic field solver providing finite-difference time-domain (FDTD) algorithm. We have used the Gaussian pulse shown in FIG. 4 as input signal to simulate the test structure shown in FIGS. 1, 2 and 3. Note the width of the used pulse is very short (about 40 ps at the 0.5-amplitude level). It means that presented consideration is related to high-speed circuits.

Figure 5:
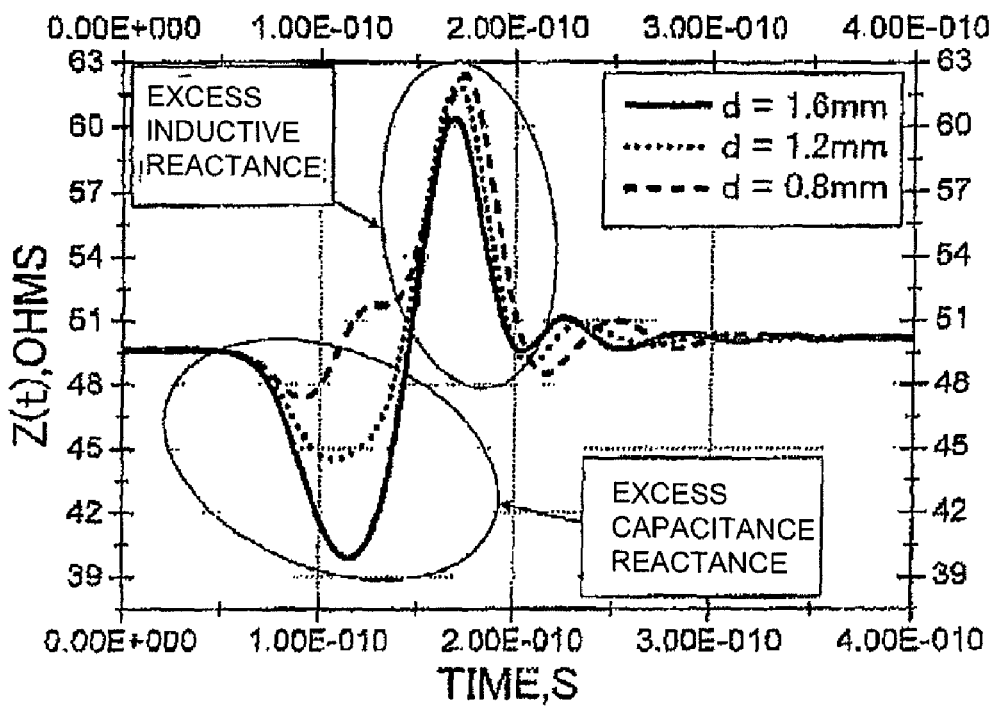
FIG. 5 shows a characteristic impedance of the test structure shown in FIG. 1 in time domain.

In FIG. 5, the characteristic impedance in time domain for three different diameters (1.6 mm, 1.2 mm and 0.8 mm) of the signal via through hole calculated according to Eq. 1 is presented.

$$Z(t) = \frac{1+\rho(t)}{1-\rho(t)} \cdot Z_0, \quad (1)$$

where Z0 is the characteristic impedance of input and output ports of the test structure and ρ(t) is the reflection coefficient from the test structure taken in time domain.

Figure 3:
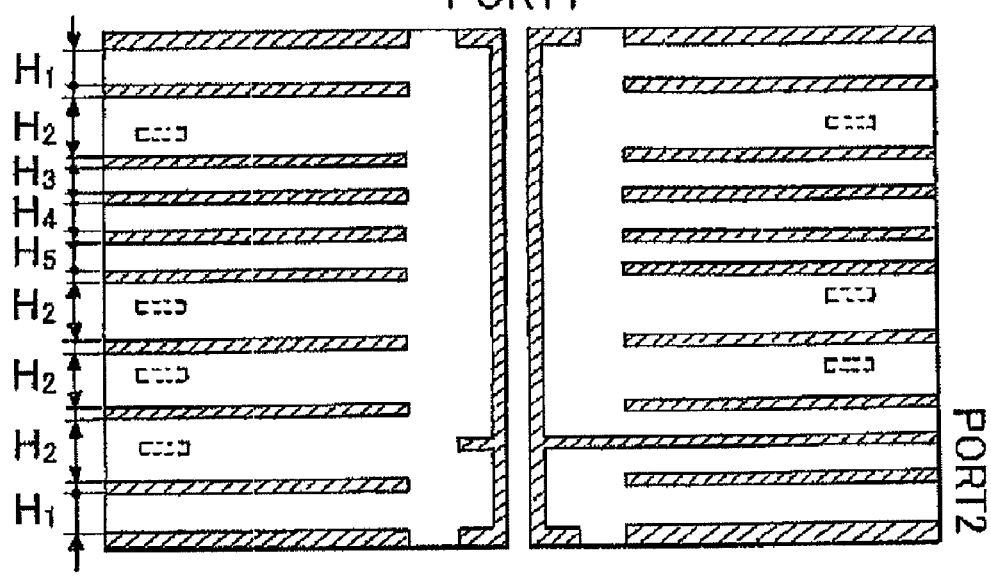
FIG. 3 is a cross-sectional view of prior-art transition from the via structure to the stripline in the 14-conductor-layer PCB.
Figure 4:
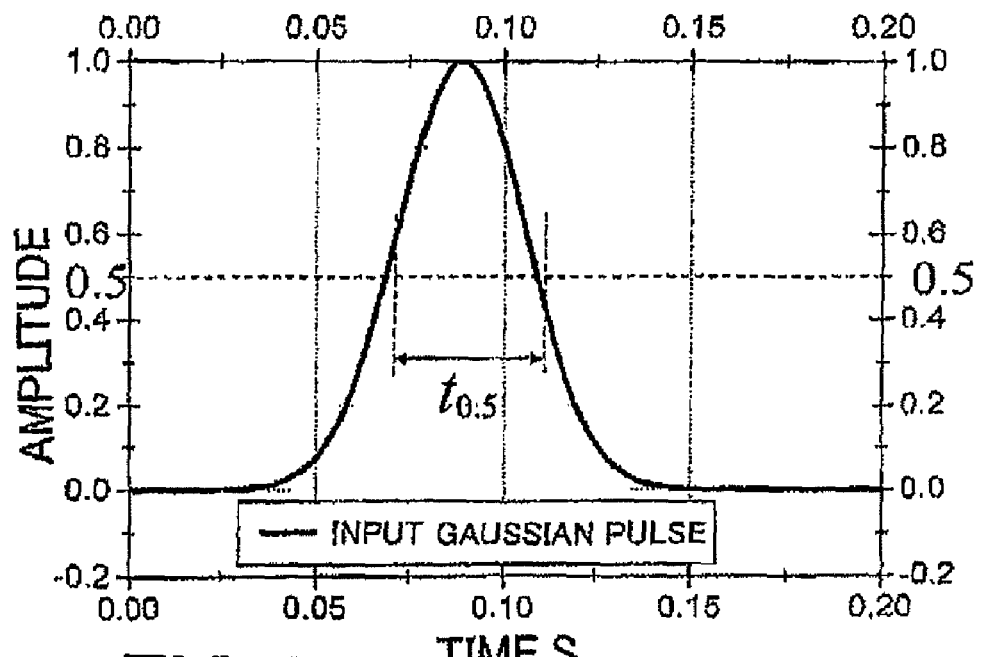
FIG. 4 shows an input Gaussian pulse used in simulations.

The Gaussian pulse is propagating from Port 1 to Port 2 as shown in FIG. 3. Port 1 is at beginning of the signal via pad and Port 2 is for the stripline. As follows from data shown in FIG. 5, the characteristic impedance of the port 1 interconnected structure and the stripline is about 50 Ohms. However, the via structure demonstrates the excess capacitance reactance depending on the diameter, d, of the signal through hole via. The characteristic impedance of the via structure has following maximum magnitudes: 40 Ohms calculated for the signal via through hole diameter of 1.6 mm; 44.5 Ohms calculated for the signal via through hole diameter of 1.2 mm; 47 Ohms calculated for the signal via through hole diameter of 0.8 mm. Decreasing the diameter of the signal via through hole leads to the improvement of the characteristic impedance matching between 50 Ohms input port and the via structure formed by the signal via 101 and ground vias 102. This effect can be explained by decreasing the capacitance between the signal via and ground vias due to decreasing the diameter of the signal via through hole. In this case, the characteristic impedance of the test via structure, Zv, can be defined as:

$$Z_v = \sqrt{\frac{L}{C}}, \quad (2)$$

where L is the distributed inductance of the via structure and C is the distributed capacitance of the via structure. Thus, manipulating the signal via through hole diameter, or the distance from the signal via to the ground vias, or both of these parameters, one can effectively control the excess capacitance reactance of the via structure.

It should be noted that the clearance hole of considered via structure is extended to the ground via surfaces to decrease the capacitive effect between the ground plates of the conductor layers of the PCB and the signal via through hole. So, in this case, the capacitance reactance is defined by ground and signal vias as well as relative permittivity and relative permeability of an isolating material of the PCB (in presented interconnected structure, this is FR-4 material).

Also, as follows from FIG. 5, the excess inductive reactance makes a very significant contribution to the impedance mismatching. As for example, for considered case, magnitude of the inductive part of the characteristic impedance achieves about 62 Ohms. This is considerably different from 50 Ohms used through whole interconnected circuit.

Figure 6:
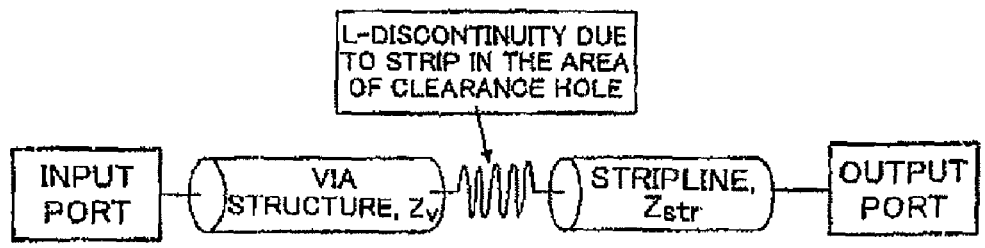
FIG. 6 is a block diagram of signal propagation in the interconnection structure shown in FIGS. 1, 2 and 3.

The main reason of this excess reactance is the inductance of the segment 104 of the strip between via pad and the stripline 109. Signal propagation in the interconnection structure shown in FIGS. 1, 2 and 3 can be explained according to block diagram shown in FIG. 6. In this block diagram, the transition from the via structure with the characteristic impedance of Zv to the planar transmission line (in our case, stripline) with the characteristic impedance of Zstr can be represented as the L-discontinuity. This transition in the form of the strip segment 104 acts as a flat wire inductor. Characteristic impedance of such inductor can be approximately represented by the following formula:

$$Z_w \approx iX_w, \quad (3)$$

where Xw is the inductive reactance of the strip segment 104.

The inductive reactance of the strip segment can be defined as: where f is the frequency of a signal and L is the inductance of the strip segment 104.

$$X_w = \omega \cdot L \quad (4)$$

with $$\omega = 2\pi f,$$

Figure 7:
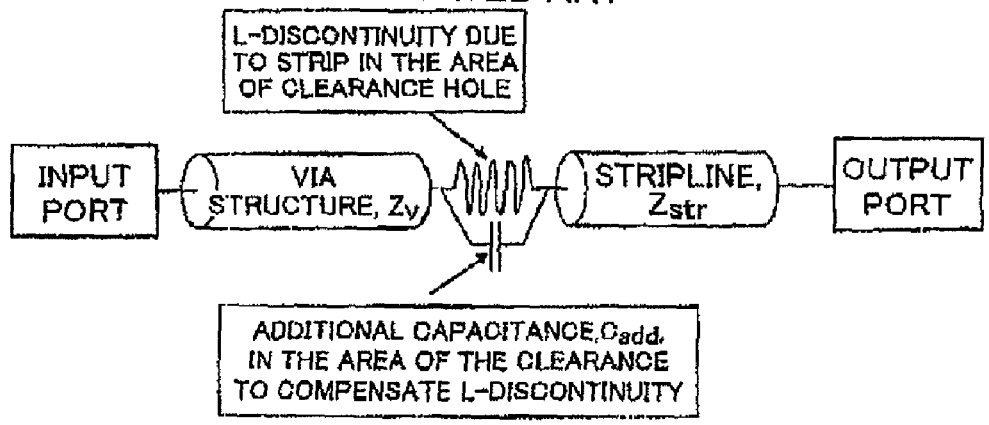
FIG. 7 is a block diagram of signal propagation in the interconnection structure with a capacitance compensation of the L-discontinuity.

To provide the characteristic impedance matching in the transition from the signal via pad to the planar transmission line in a multilayer PCB we have proposed a method to compensate the excess inductive reactance of the strip in the area of the clearance hole by introducing an additional capacitance reactance, Xadd=−1/ωCadd, to the strip segment of the considered transition. In this case, the considered interconnection structure can be represented by block diagram shown in FIG. 7. Respectively, total impedance, Zt, of the transition from the signal via pad to the planar transmission line in a multilayer PCB can be represented as:

$$Z_t = -i\frac{L}{C_{add}}\left(\frac{1}{\omega L - \frac{1}{\omega C_{add}}}\right) \quad (5)$$

where L is the total inductance of the strip segment in the area of the clearance hole and C is the total capacitance of the strip segment in the area of the clearance hole.

As follows from Eq. 5, introducing appropriate additional capacitance to the strip segment between the signal via pad and planar transmission line, one can either reduce or compensate the excess inductance reactance of the strip segment in the area of the clearance hole.

Above-mentioned additional capacitance can be achieved, as for an example, by forming the strip segment in the area of the clearance hole of an appropriate shape and dimensions.

Figure 8:
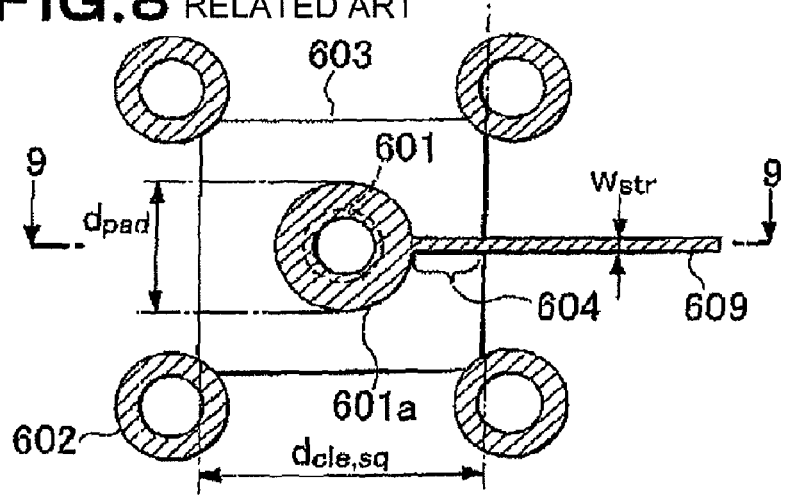
FIG. 8 is a plan view at the 12th conductor layer of prior-art transition from a via structure to a stripline in a 14-conductor-layer PCB in which large clearance hole is used to reduce the excess capacitance reactance between signal via and ground vias.
Figure 9:
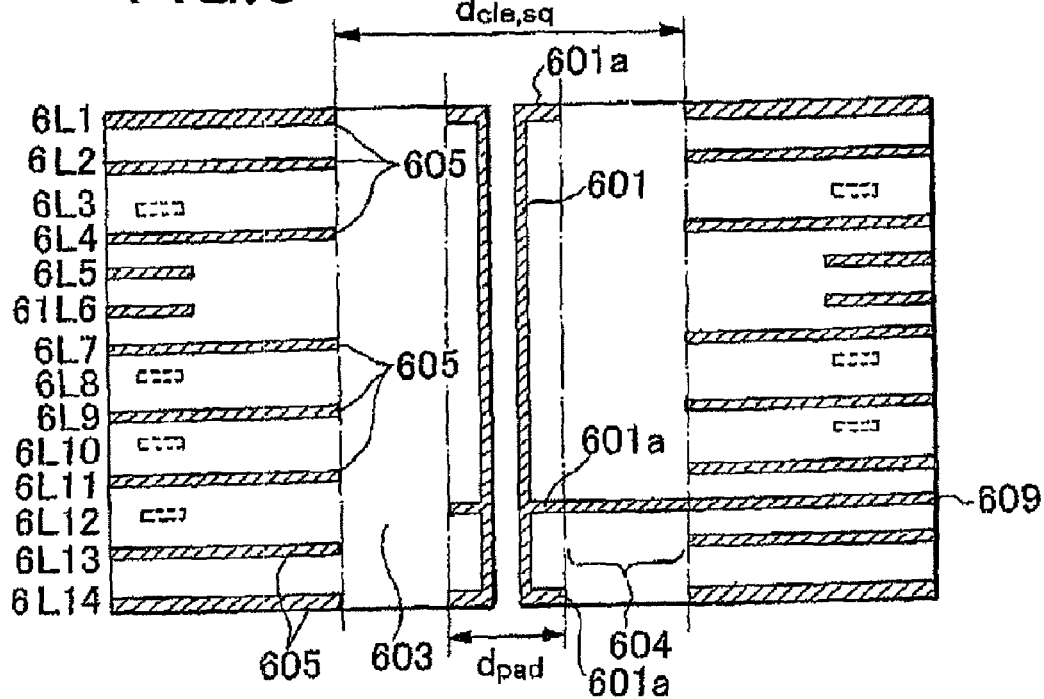
FIG. 9 is a cross-sectional view of prior-art transition from the via structure to the stripline in the 14-conductor-layer PCB.
Figure 10:
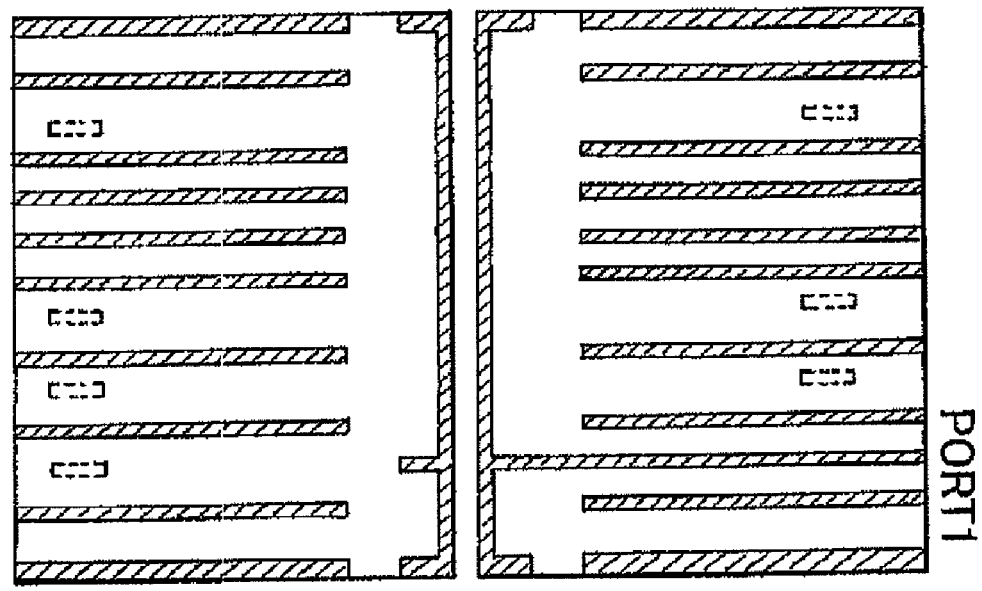
FIG. 10 shows a port notation in simulation of the interconnected structure shown in FIGS. 8 and 9.

Consider an interconnection including a via structure and a stripline as shown in FIGS. 8, 9 and 10. This via structure is similar to the via structure demonstrated in FIGS. 1, 2 and 3 but having a clearance hole with cross-sectional form and dimensions extended to the ground vias to suppress the excess capacitance reactance in the via structure. This cross-sectional form of the clearance hole 603 is formed as a square with the side of dcle,sq=4.1 mm which partially passes over the ground vias 602. Similarly to FIGS. 1, 2 and 3, the via structure comprises a signal via 601 and four ground vias 602 which are connected to the ground plates 605. Also, in considered model of the via structure, d=0.8 mm and dpad=1.6 mm. At the signal layer 6L12, a stripline 609 is connected to the signal via pad by means of strip segment 604, having the same width as the stripline 609, formed at the same conductor layer as the signal via pad 601*a* and the stripline 609.

Figure 11:
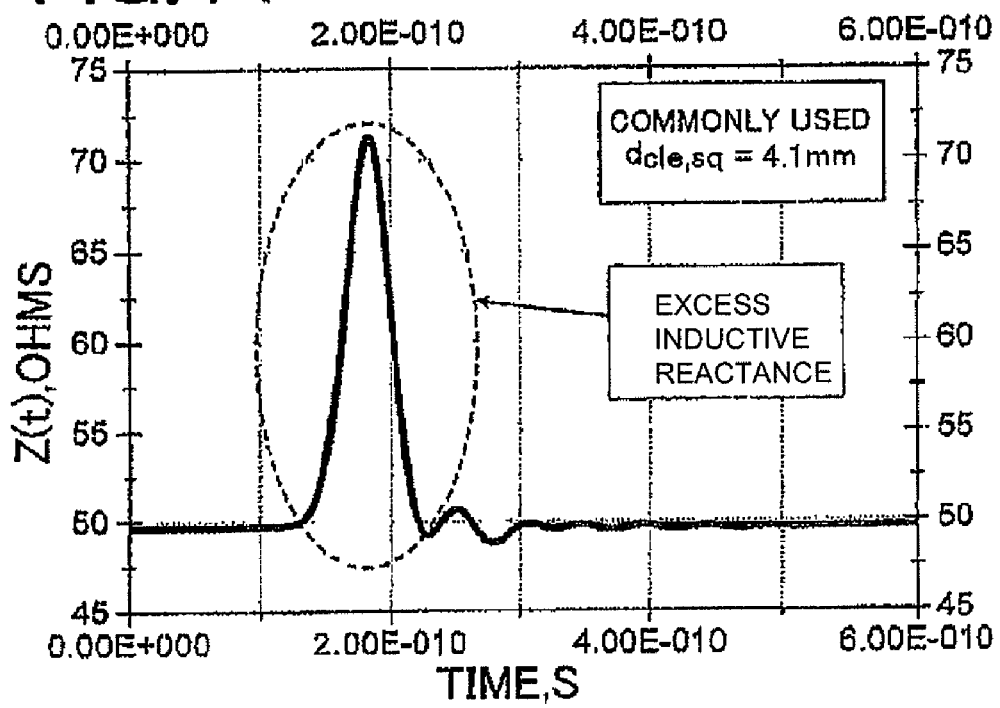
FIG. 11 shows a characteristic impedance of the interconnected structure shown in FIGS. 8, 9 and 10 in time domain.

In FIG. 11, the characteristic impedance in time domain of the interconnected structure shown in FIGS. 8, 9 and 10 is presented. This impedance was calculated by the FDTD algorithm for the signal propagating from Port 1 to Port 2 as shown in FIG. 10. As one can see in FIG. 11, the use of appropriate dimensions of the via structure (including clearance hole dimensions) can lead to a suppression of the excess capacitance reactance in the considered interconnected structure. However, another important problem appears in matching of the interconnected circuit comprising the via structure and planar transmission line. This is the excess inductive reactance which reaches in considered case about 72 Ohms. It is very different from 50 Ohms used in the interconnected circuit.

Thus, as follows from presented data for the interconnected structures, a via structure formed by signal and ground vias in a multilayer PCB and also a planar transmission line in the multilayer PCB can provide a definite and well-controllable characteristic impedance as, for an example, 50 Ohms. However, a problem of an appropriate transition from the via structure to the planar transmission line in the area of the clearance hole remains because it can considerably affect on impedance matching between the via structure and the planar transmission line.

Thus, a main object of presented invention is to provide methods to control the characteristic impedance in the transition from a signal via pad to a planar transmission line in a multilayer PCB and structures providing impedance-matched transitions in the wide frequency band from the signal via pad to the planar transmission line based on proposed methods.

So, according to the method proposed above, the excess inductive reactance can be either reduced to a predetermined value or compensated by the introduction of the additional capacitance to the strip segment.

Consider a compensated part of the transition from a signal via pad 1001*a* to a stripline 1009 in the form of one linear taper as is shown in FIGS. 12 and 13. The interconnected structure is the same as in FIGS. 1, 2 and 3. Only a single linear taper is formed to compensate the excess inductive reactance in the area of the round clearance hole. The transverse dimensions of the taper 1010 are equal to the via pad diameter at the one end and strip width at the other end. The length of the taper 1010 is equal to the characteristic dimension of the clearance hole 1003. In presented example of a round clearance hole 1003, the length of the taper is equal to the radius of the clearance hole, that is, l=dcle/2. To show advantages of the compensated transition for considered structure, we have calculated the characteristic impedance in time domain. The dimensions of the via structure and parameters of the 14-conductor-layer PCB are the same as for FIG. 8. In this consideration, the signal via with the through hole diameter d=0.8 mm, as providing a suitable characteristic impedance of the via structure, is simulated.

Figure 14:
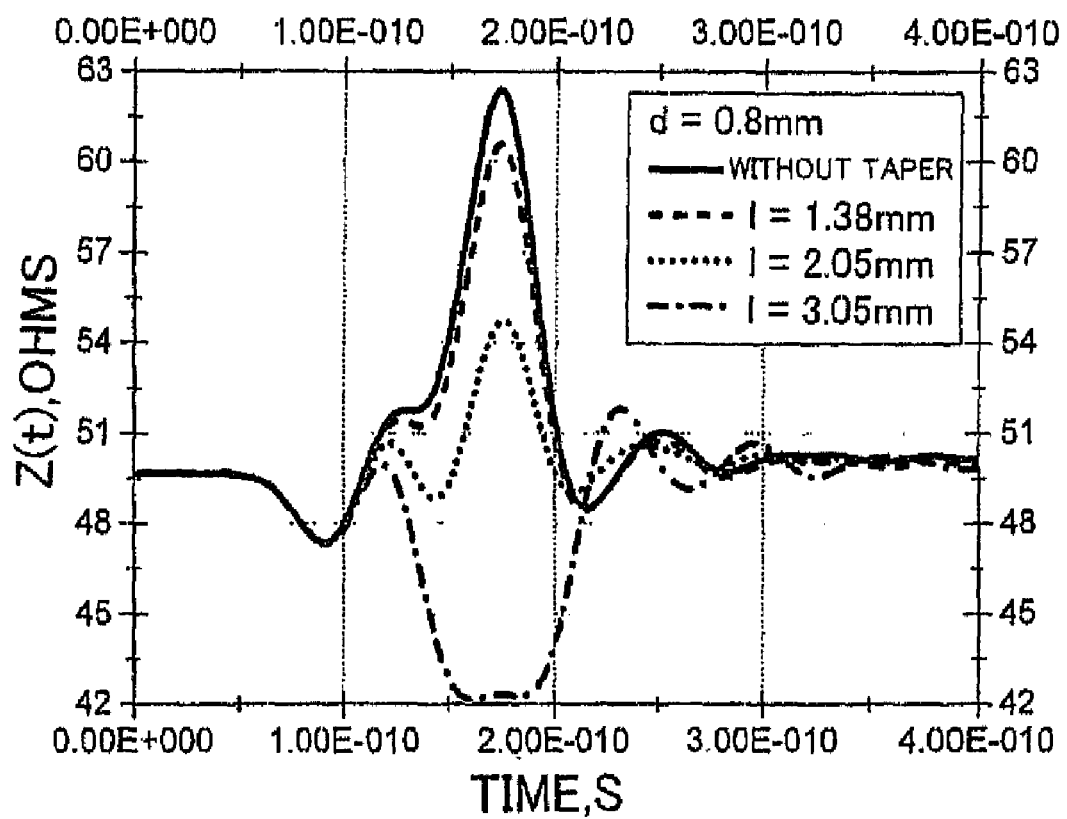
FIG. 14 shows a characteristic impedance of the test structure with through hole diameter of 0.8 mm in time domain without compensating part and with compensating part in the form of the linear taper with different taper lengths.

Also, here, we would like to emphasize the importance of the choice of the taper length. For comparison, we present data for different tapers having the lengths less and larger than the radius of the clearance hole. In FIG. 14, simulation results for the characteristic impedance in time domain of the test via structure without and with the linear tapers are shown. As follows from this figure a good impedance match (within 5 Ohms) from a practical point of view is achieved for the linear taper having the length which is equal to the clearance hole of the via structure.

Figure 15:
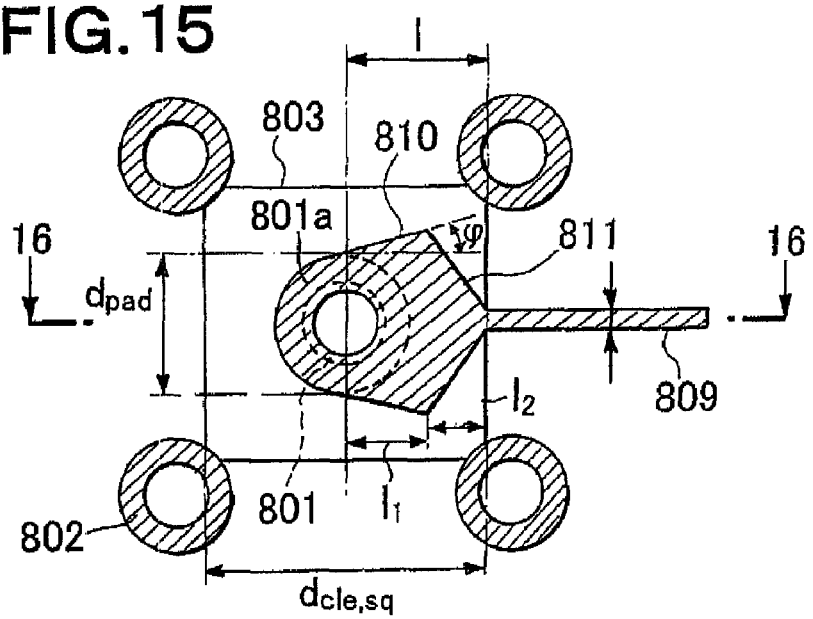
FIG. 15 is a plan view at the 12th conductor layer of broadband transition from a via structure having a square clearance hole to a stripline in a 14-conductor-layer PCB with the compensating part consisting of two linear tapers with their total length equal to the half side of the square clearance hole.
Figure 16:
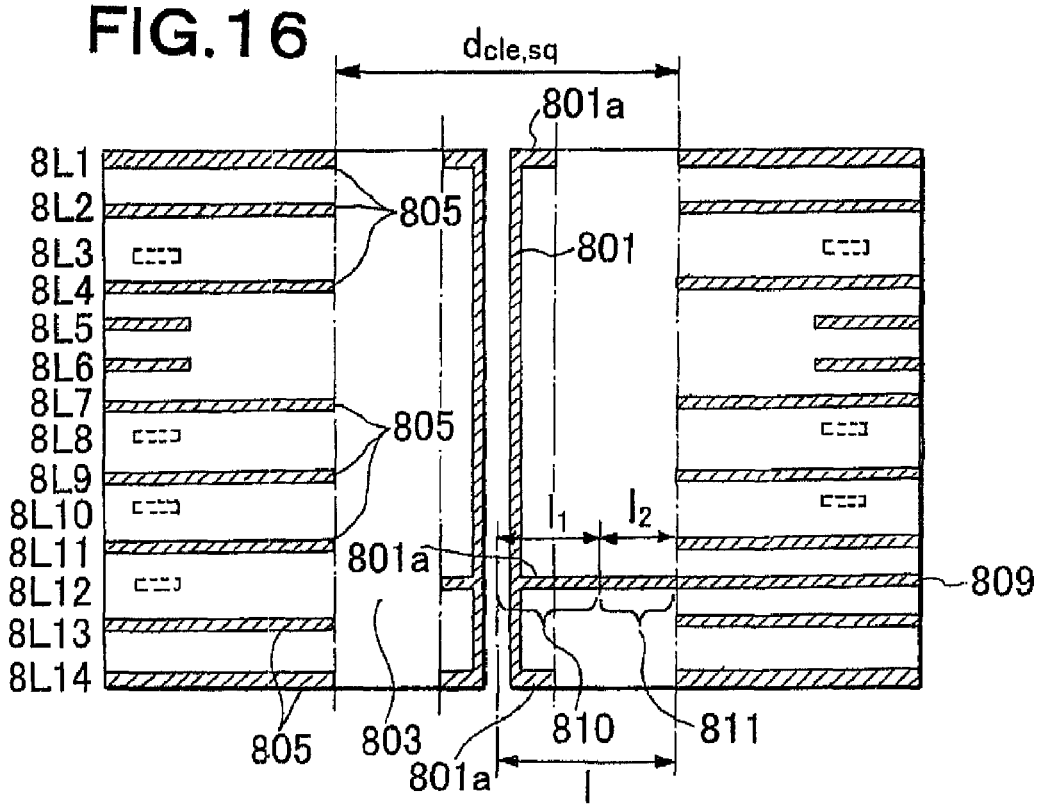
FIG. 16 is a cross-sectional view of broadband transition from a via structure having a square clearance hole to a stripline with the compensating part consisting of two linear tapers with their total length equal to the half side of the square clearance hole.

In FIGS. 15 and 16, a compensating transition from a signal via 801 to a stripline 809 is presented. In principal, for a square arrangement of ground vias, a square clearance hole is better than a circle clearance hole, because it decreases the capacitance effect of the ground plates between signal and ground vias. This compensated transition, situated between the signal via pad 801a and the stripline, is formed by two linear tapers 810 and 811. The use of the tapers gives the increase of the capacitance coupling of the transition to the ground plates of conductor layers 805 (as for example, 8L11 and 8L13) and also to ground vias 802 of the via structure. This coupling provides an additional capacitance, Cadd, to reduce the excess inductive reactance in the considered interconnection to a desirable value.

To show the effect of proposed compensating transitions on the impedance matching, the same via structure connected to the same stripline and embedded in the same 14-conductor-layer PCB as for FIG. 11 is simulated. The dimensions of the tapers 810 and 811 (see FIGS. 15 and 16) are as following: l1=1.0 mm, l2=1.05 mm and φ=30°. Note the total length of the tapers is equal to the characteristic dimension of the clearance hole 803.

Figure 17:
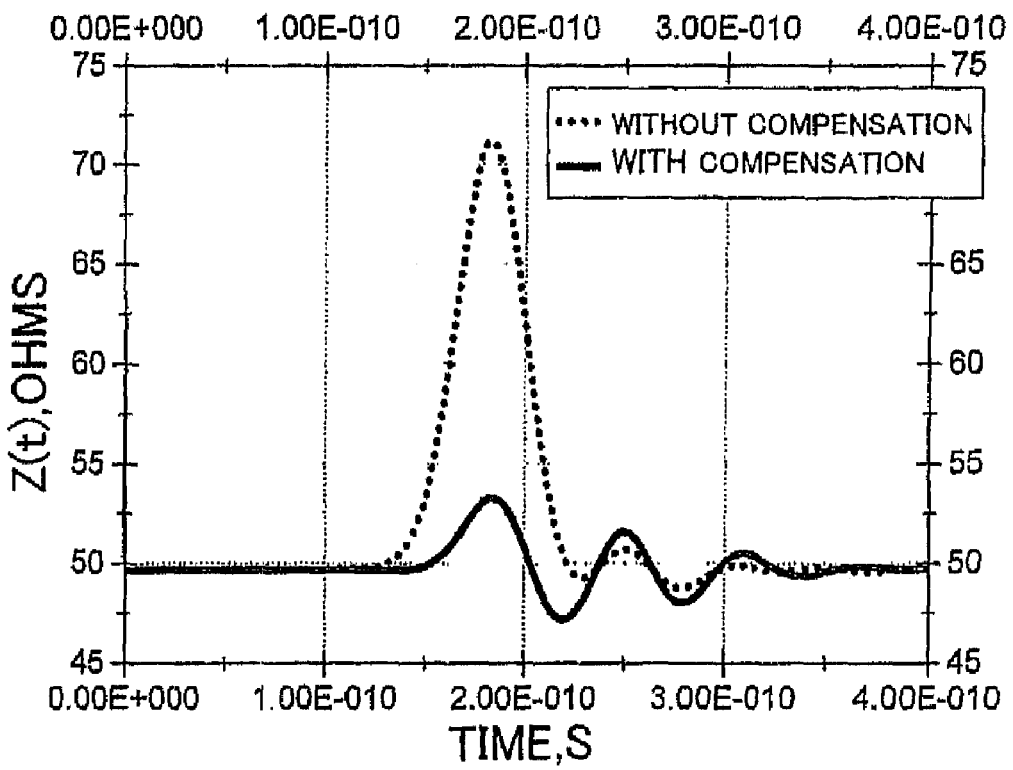
FIG. 17 shows a characteristic impedance in time domain of the interconnected circuits without and with compensating part as shown in FIGS. 8 and 9 and FIGS. 15 and 16, respectively.

In FIG. 17, the characteristic impedances in time domain are presented for considered interconnections with and without compensating parts. As follows from this figure, in the interconnected structure with compensating part consisting of two linear tapers, the excess inductive reactance is reduced to a predetermined value. In considered case, the predetermined value is within the 50±5 Ohms. This is an acceptable magnitude in most high-speed interconnected circuits.

Thus, if it is necessary to compensate an excess inductive reactance in the transition from a via structure to a planar transmission line in a multilayer substrate, then a compensating part in the form of the two linear tapers can be used. The total length of the tapers can be equal to the characteristic dimension of the clearance hole in the direction of the transmission line (see above-mentioned structure). The length of the first taper connected to the signal via pad and the taper angle (angle denoted as φ in above-mentioned structure) can be defined by a three-dimensional full-wave electromagnetic-field solver changing step-by-step one of mentioned parameters to achieve a predetermined limit of variation in the characteristic impedance of an interconnected circuit. Note parameters of the second taper connected to the planar transmission line are automatically determined by dimensions of the first taper because the total length of the tapers is known.

Thus, simulated data for the test structure shown in FIGS. 15 and 16 demonstrate applicability of proposed method to provide impedance matching between a via structure and a planar transmission line by means of compensation of the excess inductive reactance in the transition from the signal via pad to the planar transmission line.

Returning FIG. 14, the taper with small length (in our case l=1.38 mm) shows high excess inductive reactance (similar to the test via structure without taper). On the other hand, a long taper (3.05 mm for presented test structure) leads to higher excess capacitance reactance.

Thus, a key point to realize a high-performance transition from the via pad to the planar transmission line is not only the use of the compensating part in the form of a linear taper but also its length as follows from demonstrated data in FIG. 14.

Note, in the case of the longer taper, the excess capacitance reactance is injected in the test via structure. It can be explained by a difference in the width of the planar transmission line (in considered case, stripline).

The part of planar transmission line at the boundary of the clearance hole area has wider width if it is compared with end of the taper connected to the stripline having predefined characteristic impedance (for example 50 Ohms). Because the wider stripline has larger capacitance, then a long taper can give a large excess capacitance in the via-to-transmission-line transition.

The methods proposed here are effective when the cross-sectional dimensions of the clearance hole of a via structure are large enough. Large clearance hole can be used in design of high-speed interconnections to reduce the excess capacitance reactance of the via structure. However, in this case, the strip segment in the area of the clearance hole can lead to an excess inductive reactance. Our methods are for structures in which the excess inductive reactance appears.

Figure 18:
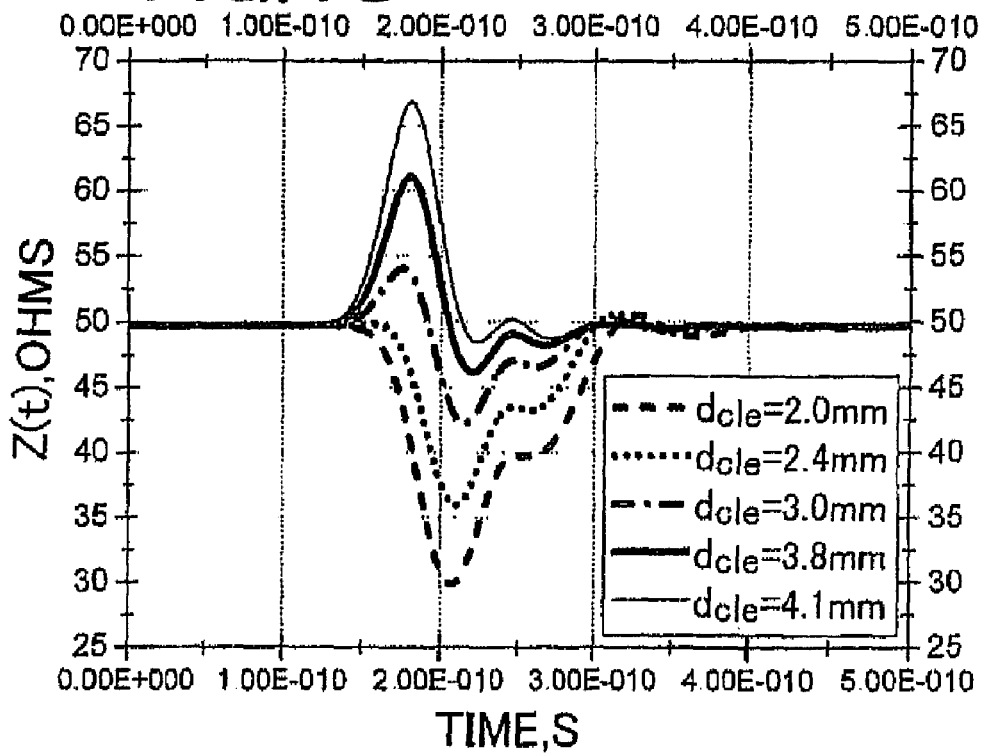
FIG. 18 shows a characteristic impedance of the test structure shown in FIGS. 1, 2 and 3 with different clearance hole diameters.

Consider an interconnected structure as shown in FIGS. 1, 2 and 3. The dimensions of this structure are the same as for FIG. 5, but only d=0.8 mm and dpad=1.6 mm are used. Also, the different dimensions of the clearance hole are applied here. In FIG. 18, we present simulated data of the structure for clearance hole diameters which are equal to 2.0 mm, 2.4 mm, 3.0 mm, 3.8 mm and 4.1 mm. As follows from these simulated data, the excess inductive reactance in considered interconnected structures is appeared for the clearance hole diameters of 3.0 mm, 3.8 mm and 4.1 mm. Thus, for such clearance holes, the application of the methods compensating the excess inductive reactance is necessary. We name these clearance holes as "large" clearance holes.

Figure 19:
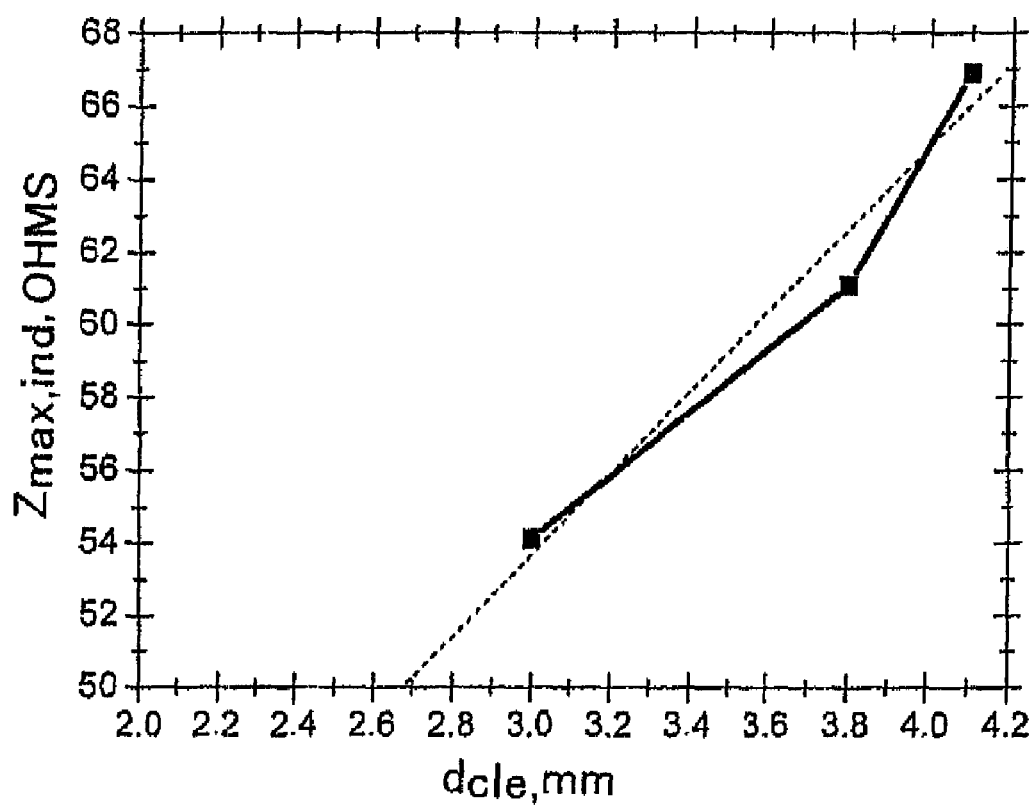
FIG. 19 shows a maximum of magnitudes of the characteristic impedance due to the excess inductive reactance as a function of the clearance hole diameter.

The minimal dimensions determining the large clearance hole term can be defined by a way, for an example, as shown in FIG. 19. This figure demonstrates maximal magnitudes of the characteristic impedance due to the excess inductive reactance as a function of the clearance hole diameter. These magnitudes are defined from data presented in FIG. 18. Using an approximation, as for an example linear fitting, we can obtain the maximal diameter of the clearance hole for which the excess inductive reactance is disappeared. For considered case, this is dcle≈2.7 mm. Therefore, the clearance hole with more diameter than 2.7 mm can be considered as large one.

The above-mentioned approach to determine "large" dimensions of a clearance hole of a via structure can be applied to different cross-sectional forms of the clearance hole used in via structures.

Figure 20:
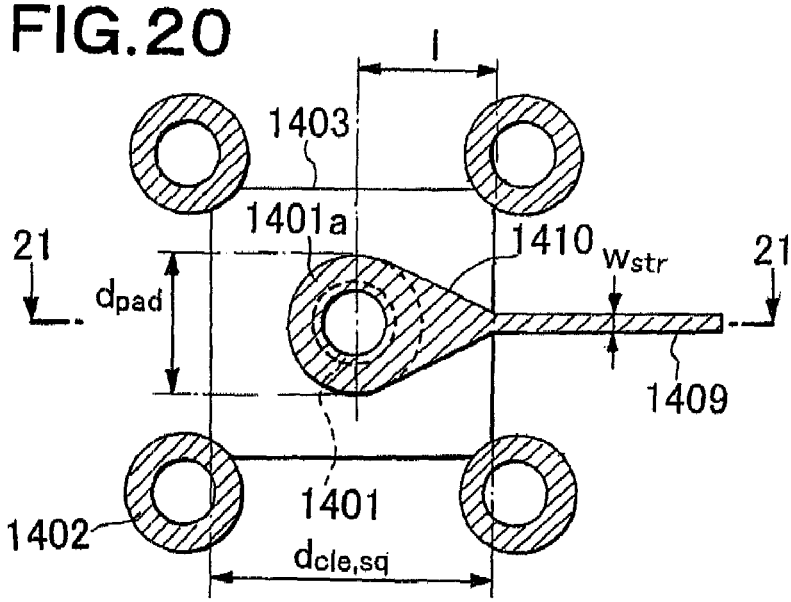
FIG. 20 is a plan view at the 12th conductor layer of broadband transition from a via structure to a stripline in a 14-conductor-layer PCB with the compensating part in the form of a linear taper.
Figure 21:
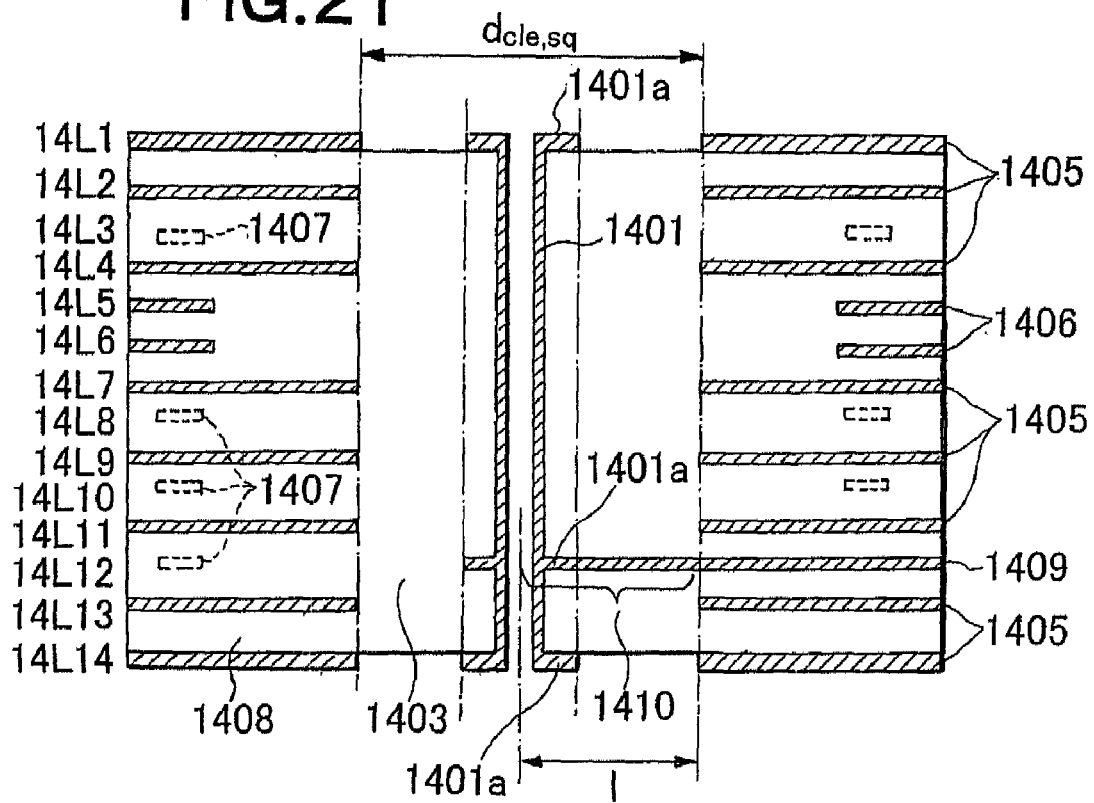
FIG. 21 is a cross-sectional view of broadband transition from a via structure to a stripline with the compensating part in the form of a linear taper.

Consider the application of one linear taper as a method for the compensation of the excess inductive reactance to other via structures. In FIGS. 20 and 21, the transition from a signal via pad to a planar transmission in a multilayer PCB is shown. Similar to the structure shown in FIGS. 12 and 13, the test configuration comprising a signal via 1401, four ground vias 1402 which are connected to the ground plates 1405, but a square clearance hole 1403 which separates the signal via from the planar conductor layers. The broadband transition from the signal via pad 1401a to the stripline 1409 disposed at the signal layer 12 is realized by means of a linear taper 1410.

The length of the linear taper in this case is equal to the half of the side of the square clearance hole, that is, l=dcle, sq/2.

Figure 22:
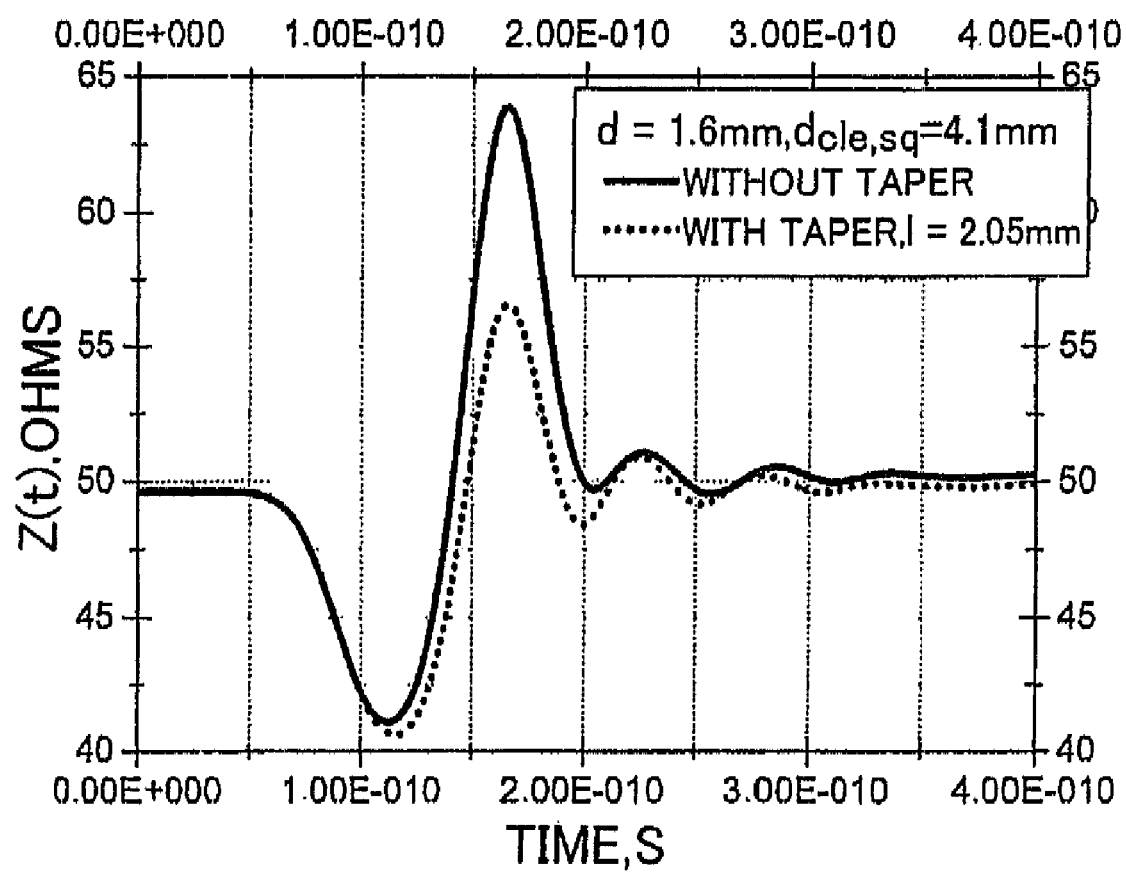
FIG. 22 shows a characteristic impedance of the test structure with via through hole diameter of 1.6 mm and square clearance hole in time domain without compensating part and with compensating part in the form of linear taper with length equal to half of side of the square clearance hole.

In simulations, the dimensions of the test structure are the same as for FIG. 17 but only d=1.6 mm and dpad=2.2 mm. Calculated characteristic impedances for interconnected structures with and without linear tapers are shown in FIG. 22. As follows from this figure the use of the linear taper leads to considerable reduction of the excess inductive reactance and improvement of impedance match in multilayer PCBs similarly to the case of the round clearance hole. However, the use of the length of the linear taper equal to the characteristic dimension of the clearance hole in the direction of the transmission line is not sufficient in some cases. In FIG. 22, the magnitude of the characteristic impedance for the structure with the linear taper achieves 56 Ohms. In many applications such excess inductive reactance is not acceptable for interconnections embedded in a multilayer substrate.

That is why, here, we also propose another method and structures for further improvement of transition from the signal via pad to the planar transmission line in multilayer substrate. As one can see in FIGS. 14 and 22, in spite of improvement, the excess inductive reactance exists for the linear taper having the length which is equal to characteristic dimensions of the clearance hole in the direction of the planar transmission line.

Figure 23:
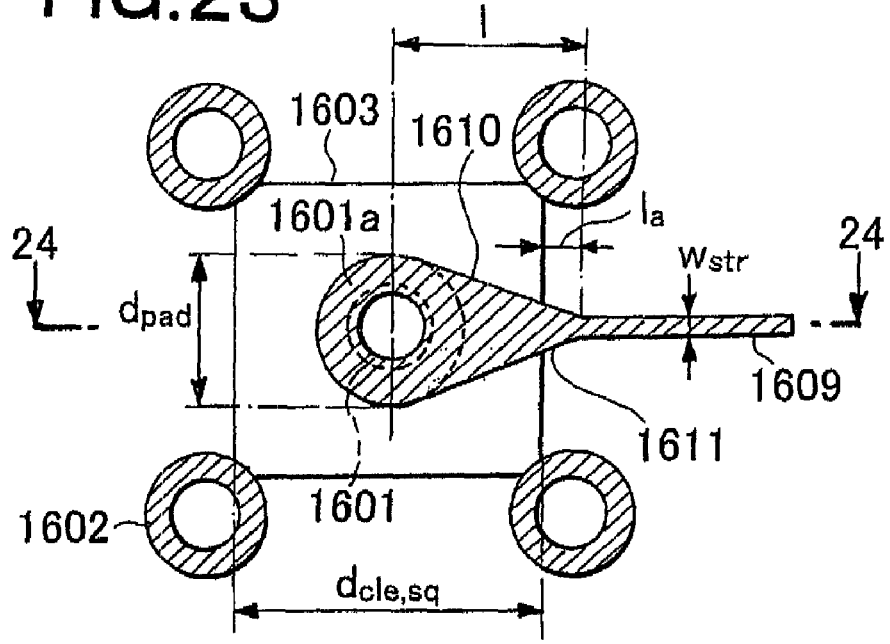
FIG. 23 shows a plan view at the 12th conductor layer of broadband transition from a via structure to a stripline with the compensating part in the form of linear conductive tapers disposed in the area of the clearance hole and planar transmission line.

To further reduce this inductive reactance, we will introduce small excess capacitance reactance by increasing the length of the linear taper. This approach can be explained using Eq.5. The part of the linear taper 1611 in the area of the stripline 1609, as shown in FIG. 23, having length $l_\alpha$ gives additional capacitance compared with the capacitance of the regular planar transmission line 1609. Thus, increasing the length of the taper gradually one can inject a small additional capacitance to the interconnected structure to reduce the excess inductive reactance to the required magnitude. In FIG. 25, calculated characteristic impedance in time domain is shown for the tapers for which the length is changed smoothly step-by-step. The dimensions of considered structure are the same as for FIG. 20. As follows from the FIG. 25 the excess capacitance in the area of the stripline 1609 can reduce the excess inductive reactance in the transition from the via pad 1601 to the stripline 1609. Note that extremum points are practically at the same time as shown in FIG. 25. Using such calculations for the tapers with different lengths one can obtain the design curve for compensating part of the transition in the form of the linear taper which can give required excess inductive reactance decrease. In FIG. 26, such design curve for the linear taper having the length larger than half side of the square clearance hole is presented. In this figure the characteristic impedance, taken in extremum points shown in FIG. 25, versus the difference between the length of the taper and half side of the square clearance hole is presented. This difference, $\Delta l$, is defined according to following equation:

$$\Delta l = l - \frac{d_{cle,sq}}{2}. \tag{6}$$

Thus, using the FIG. 26 one can define the length of the linear taper providing the required compensation of the excess inductive reactance in the transition from the signal via pad to the planar transmission line.

Figure 24:
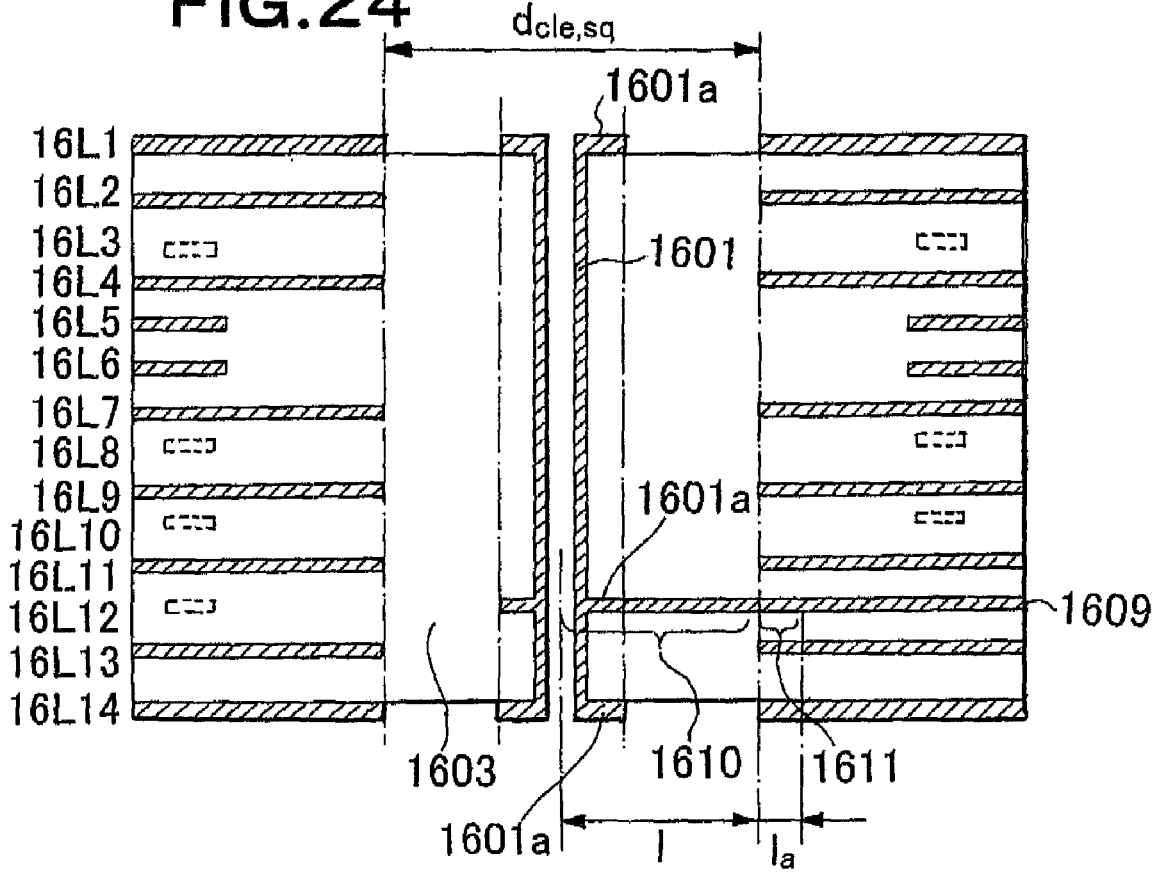
FIG. 24 is a cross-sectional view of broadband transition from a via structure to a stripline with the compensating part in the form of linear conductive tapers disposed in the area of the clearance hole and planar transmission line.
Figure 27:
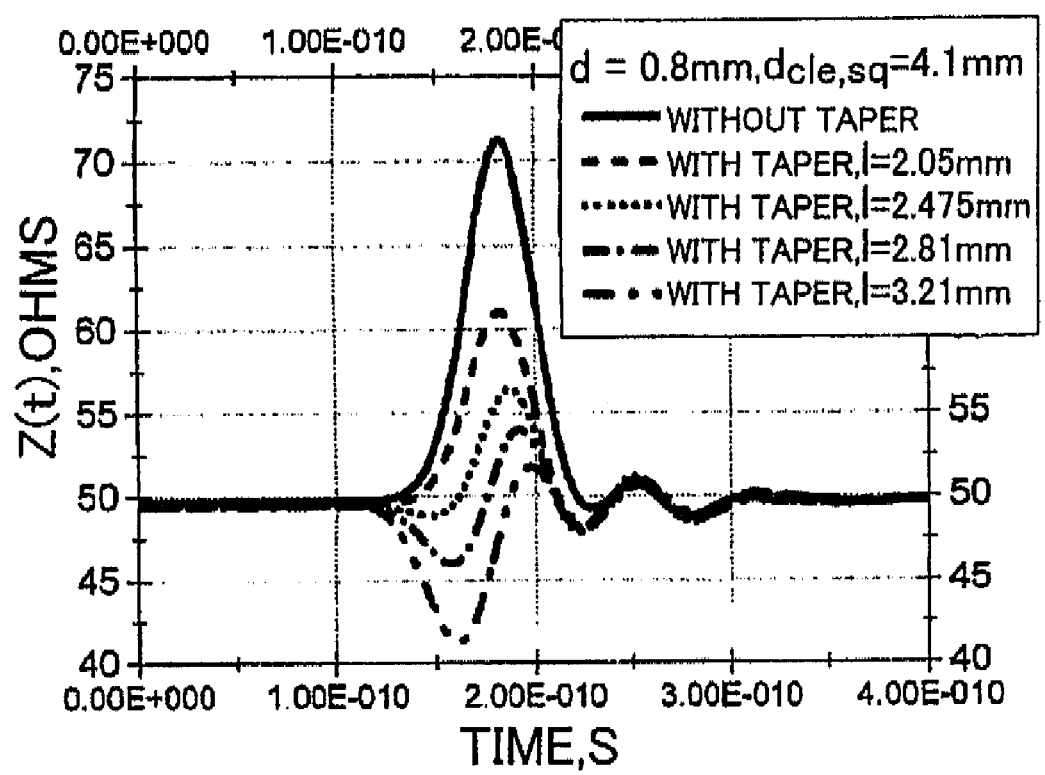
FIG. 27 shows a characteristic impedance of the test structure with via through hole diameter of 0.8 mm and square clearance hole in time domain with compensating part in the form of linear taper in which small additional capacitance is injected by the increase of the length of the taper.

However, in spite of reduction of excess inductive reactance for the via structure demonstrated in FIGS. 23 and 24 the maximum of the capacitance reactance is more than 40 Ohms as shown in FIG. 25. One of ways to reduce this capacitance reactance is decreasing the diameter of the signal via through hole (see FIG. 5). In FIG. 27, the characteristic impedance in time domain for the structure shown in FIGS. 23 and 24 is demonstrated. The dimensions of the structure are the same as for FIG. 25 but only the via through hole diameter is 0.8 mm. As one can see in FIG. 27, the structure with taper of 2.81 mm length shows the variation of the characteristic impedance within 10% that is acceptable in many practical applications.

Note that another method providing the compensation of the excess inductive reactance in the area of the clearance hole has been shown above according to FIGS. 15 and 16.

It is clear that above-mentioned methods can be applied to other via interconnections in multilayer substrates such as single-ended and differential ones.

In FIGS. 28 and 29, broadband transition from a single signal via pad 1901a to a stripline 1909 in 12-conductor layer PCB is shown. The compensation part in this transition is realized by means of two linear tapers: one of them 1910 is in the area of the clearance hole 1903; another 1911 is in the area of a planar transmission line 1909 to achieve a required compensation.

Figure 30:
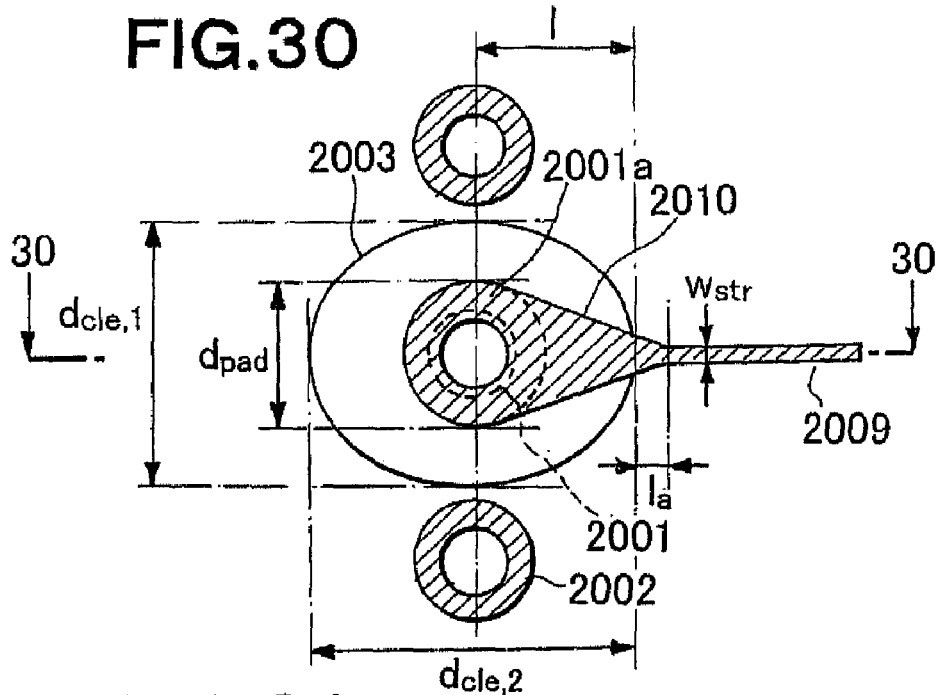
FIG. 30 is a plan view at the 12th conductor layer of broadband transition in the 14-conductor-layer PCB from a signal via surrounding two ground vias and having a predetermined form of clearance hole to a stripline with the compensating part in the form of linear taper.
Figure 31:
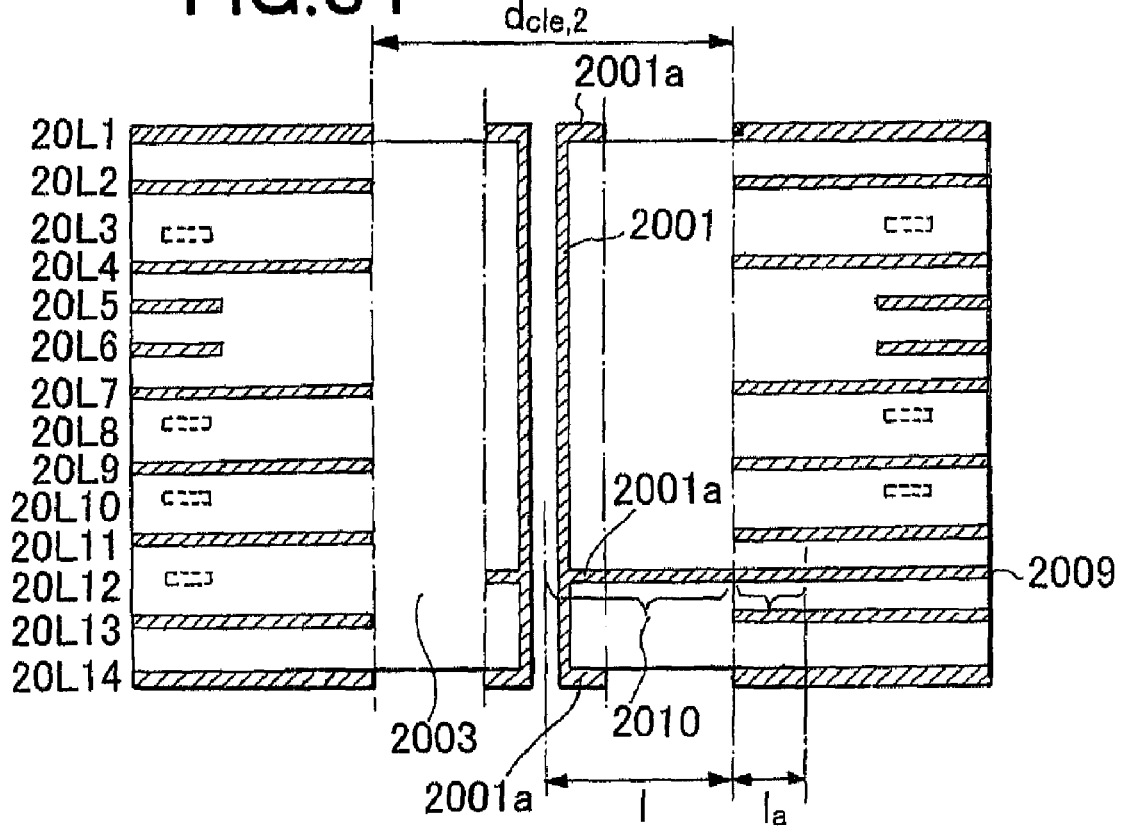
FIG. 31 is a cross-sectional view of broadband transition from a signal via surrounding ground vias and having a predetermined form of clearance hole to a stripline with the compensating part in the form of linear taper.

Also, broadband transitions can be formed for via structures having different number of ground vias and different forms of the clearance hole. In FIGS. 30 and 31, a via structure with two ground vias and an elliptical clearance hole is shown as for an example.

Figure 32:
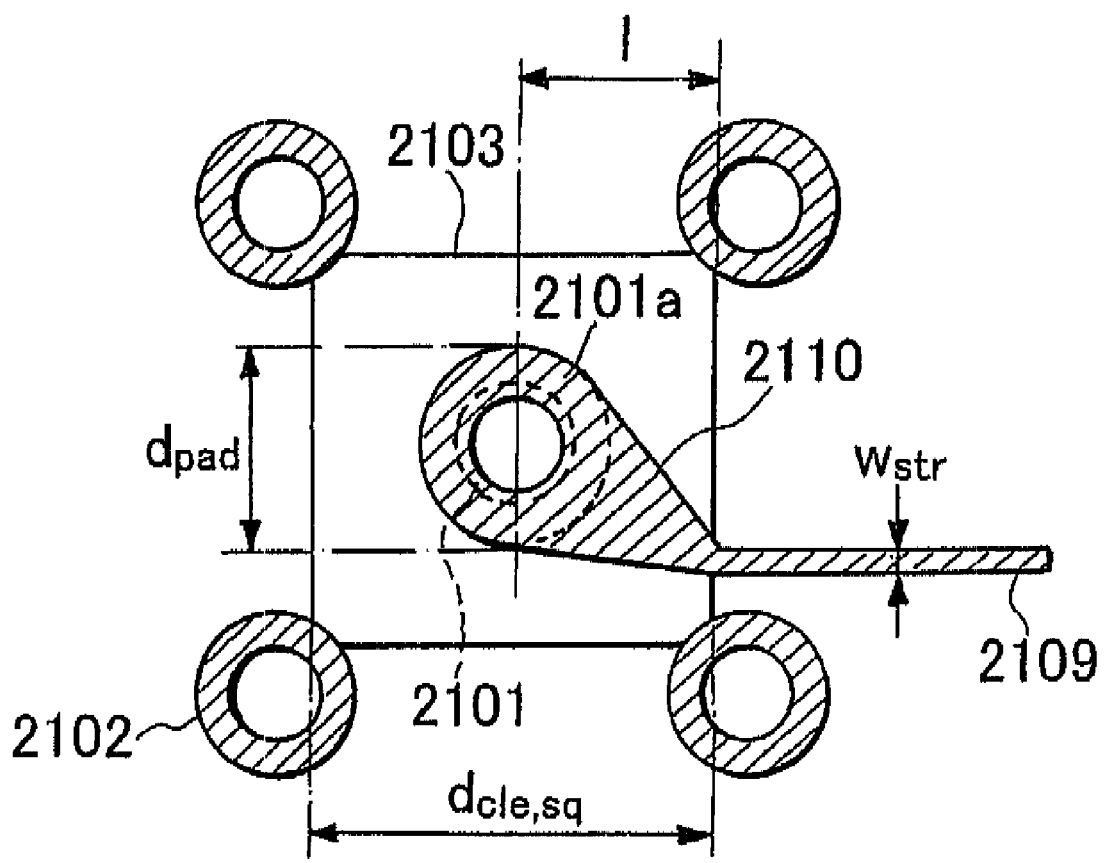
FIG. 32 is a plan view of broadband transition at a conductor layer of a multilayer PCB from a signal via to a stripline disposed asymmetrically to ground vias.

It should be emphasized that a broadband transition can be formed for any location of planar transmission line relatively ground vias (symmetrically or asymmetrically). An example of asymmetrical position of a planar transmission line and an appropriate linear taper in the area of the clearance hole for this case is shown in FIG. 32.

Figure 33:
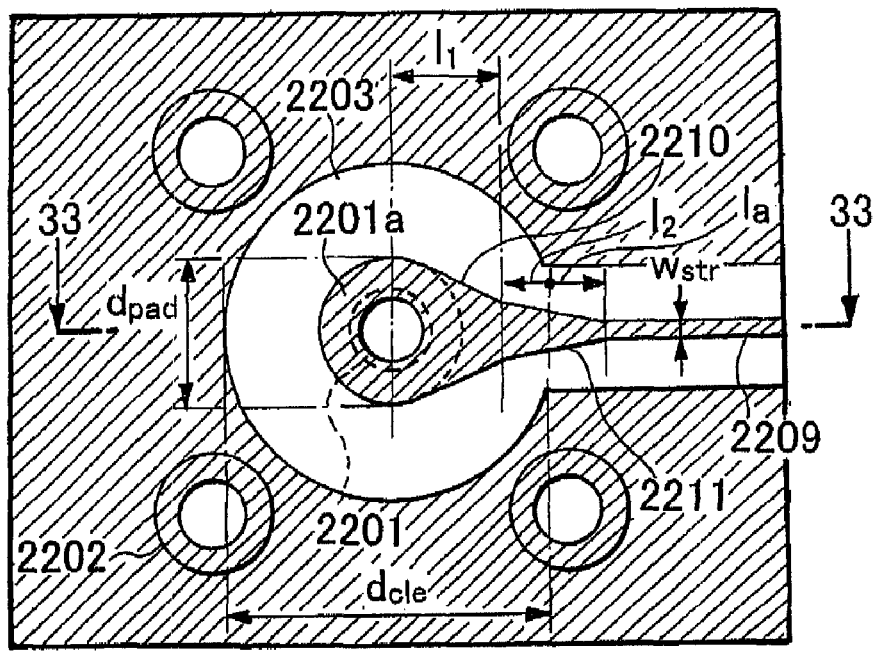
FIG. 33 is a bottom view of broadband transition in a 14 conductor layer PCB from a signal via to a coplanar microstrip line disposed at 14th conductor layer.
Figure 34:
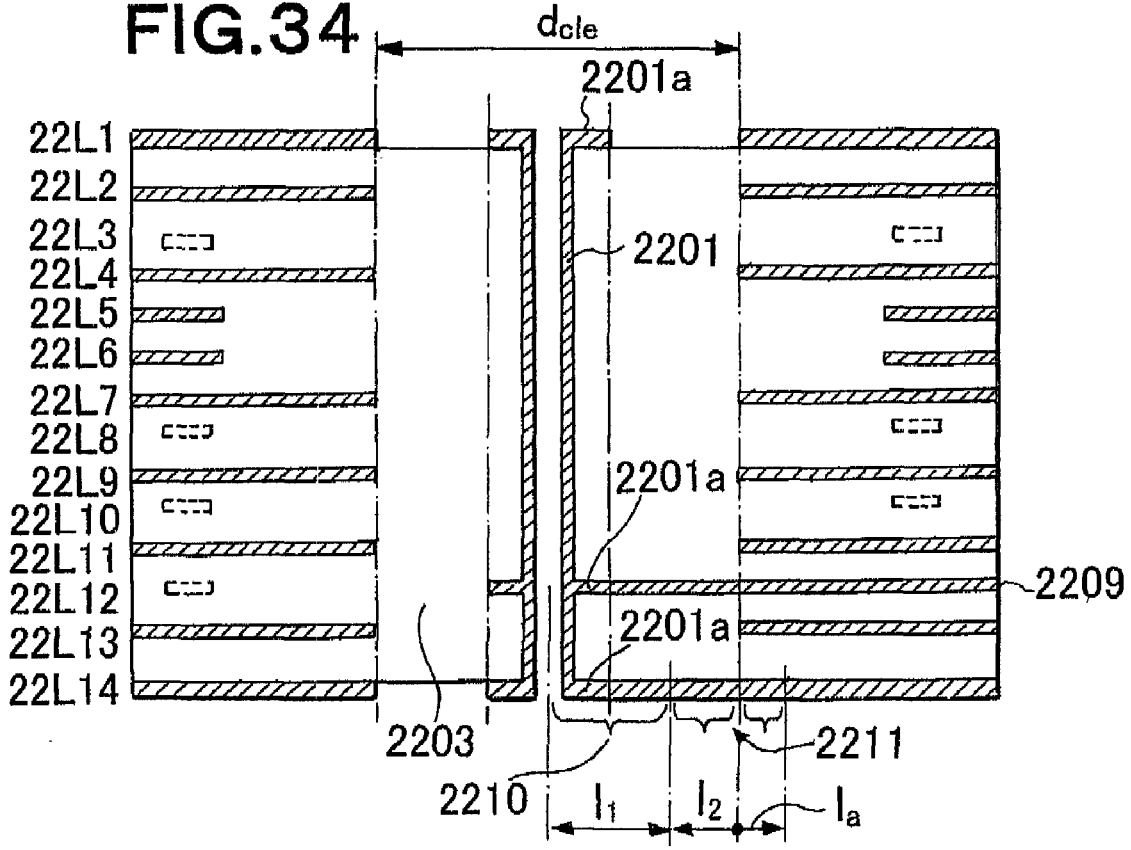
FIG. 34 is a plan view of broadband transition from a signal via to a coplanar microstrip line disposed at 14th conductor layer.

Aforementioned methods to form broadband transitions from via structures in multilayer PCBs can be applied to different types of transmission lines such as microstrip lines, coplanar waveguides, striplines and so on. In FIGS. 33 and 34, a broadband transition from a signal via to a coplanar microstrip line disposed at 14th conductor layer of a 14-conductor layer PCB is shown for an example. This transition consists of two linear tapers: One taper 2210 is formed in the area of the clearance hole; another taper 2211 is formed in the area of the clearance hole and planar transmission line 2209. The part of the taper 2211 having length la in the area of the planar transmission line gives an additional capacitance. The shapes and lengths of the linear tapers are chosen to provide compensation of the excess inductive reactance in the area of the clearance hole.

Figure 35:
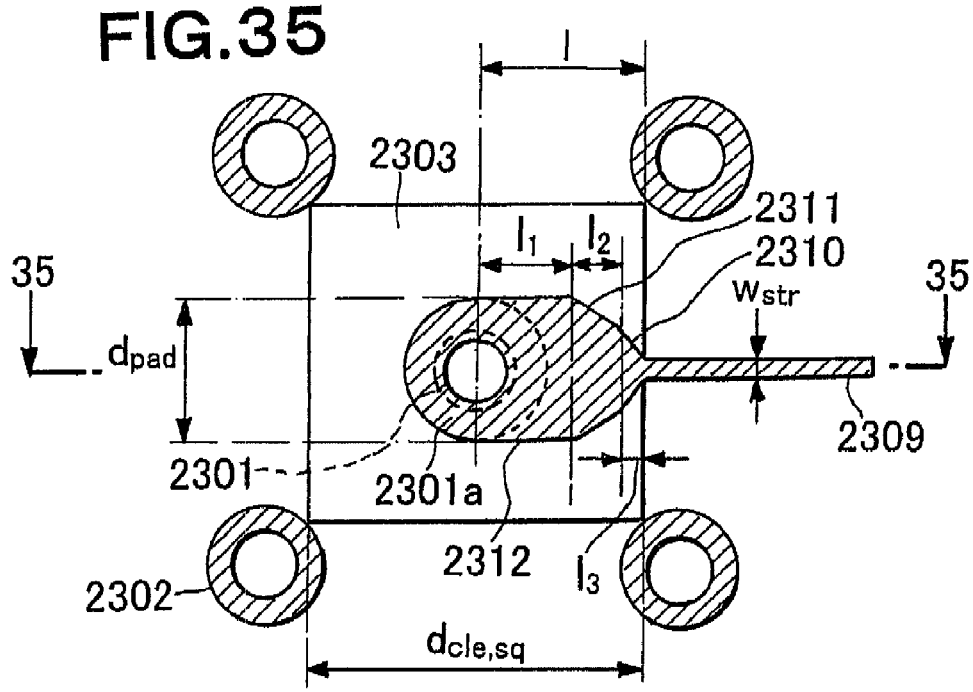
FIG. 35 is a plan view at the 10th conductor layer of broadband transition from a via structure to a stripline in a 14-conductor-layer PCB with the compensating part consisting of three linear tapers with their total length equal to the half side of the square clearance hole.
Figure 36:
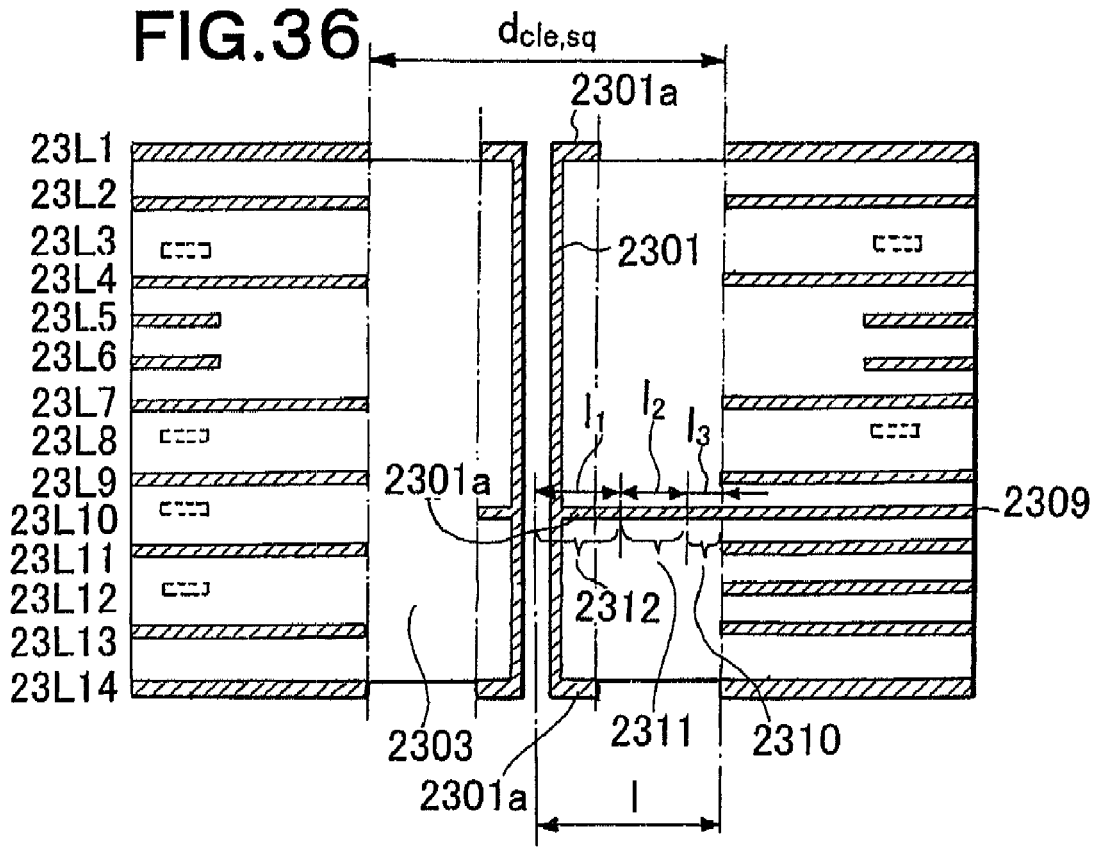
FIG. 36 is a cross-sectional view of broadband transition from a via structure to a stripline with the compensating part consisting of three linear tapers with their total length equal to the half side of the square clearance hole.

To obtain a compensation of the excess inductive reactance a different number of linear tapers can be used. In FIGS. 35 and 36, a broadband transition from a signal via pad to a stripline disposed at the 10th conductor layer of a 14-conductor-layer PCB is shown. This transition includes three linear tapers having form and dimensions to compensate the excess inductive reactance of a strip in the area of the clearance hole to a required value.

Figure 37:
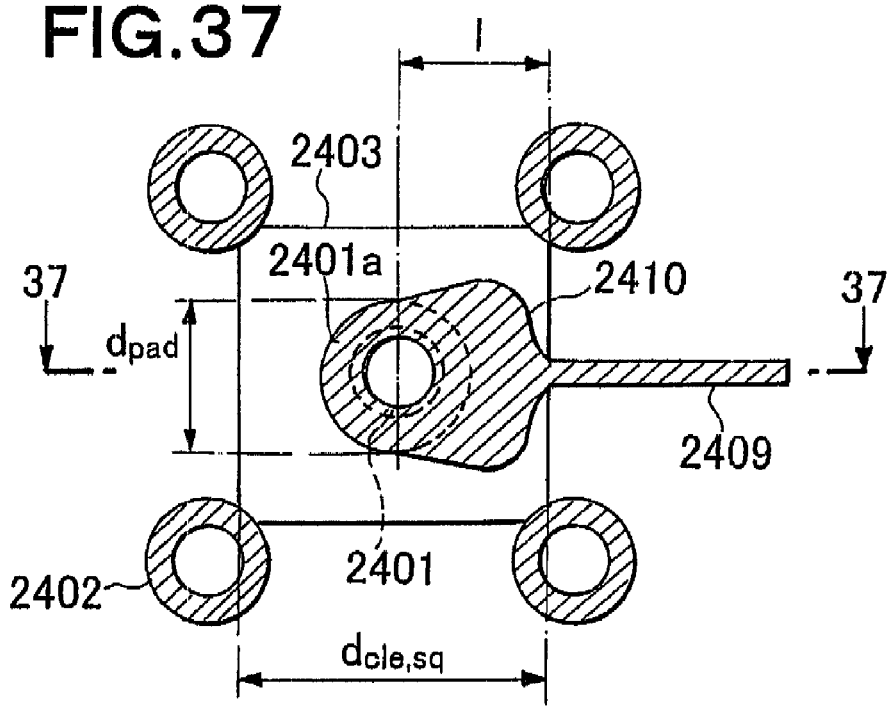
FIG. 37 is a plan view at the 8th conductor layer of broadband transition from a via structure to a stripline in a 10-conductor-layer PCB with the compensating part consisting of a smooth transition from a signal via pad to the stripline.
Figure 38:
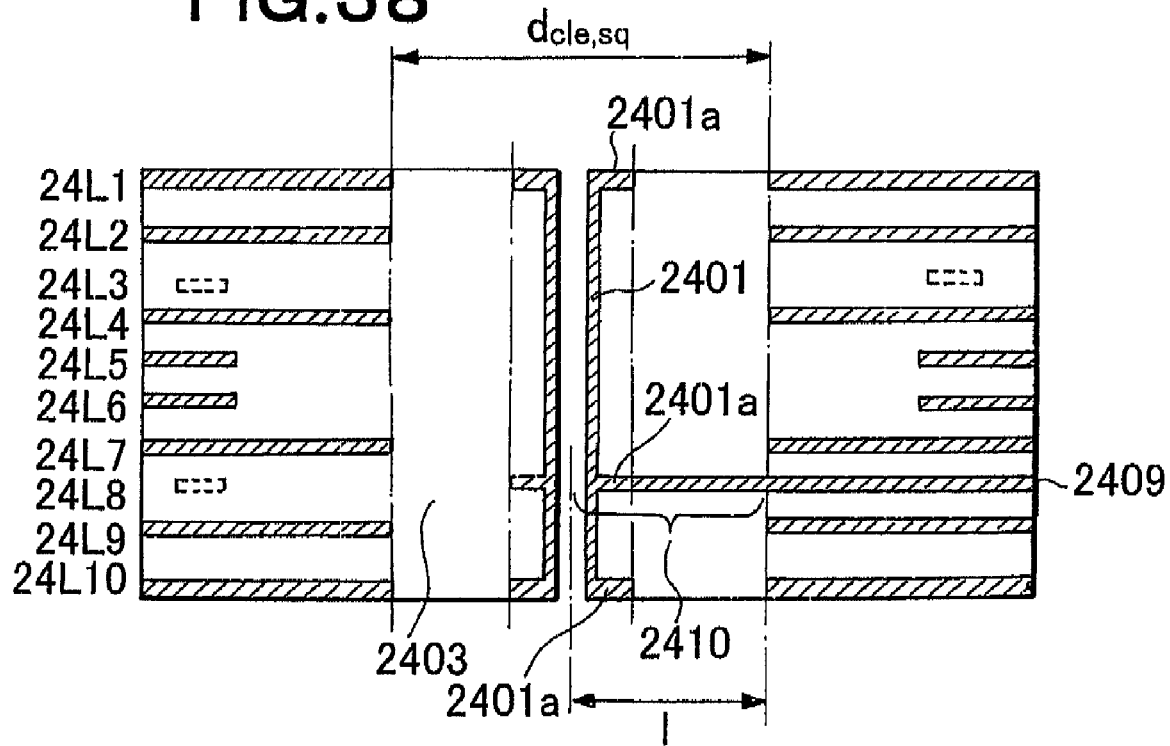
FIG. 38 is a cross-sectional view of broadband transition from a via structure to a stripline in a 10-conductor-layer PCB with the compensating part consisting of a smooth transition from a signal via pad to the stripline.

Form of a transition from a signal via pad to a planar transmission line in a multilayer substrate can be different to provide a compensation of the excess inductive reactance to a desired value. In FIGS. 37 and 38, a smooth transition 2410 from the signal via pad to the stripline is presented.

Figure 39:
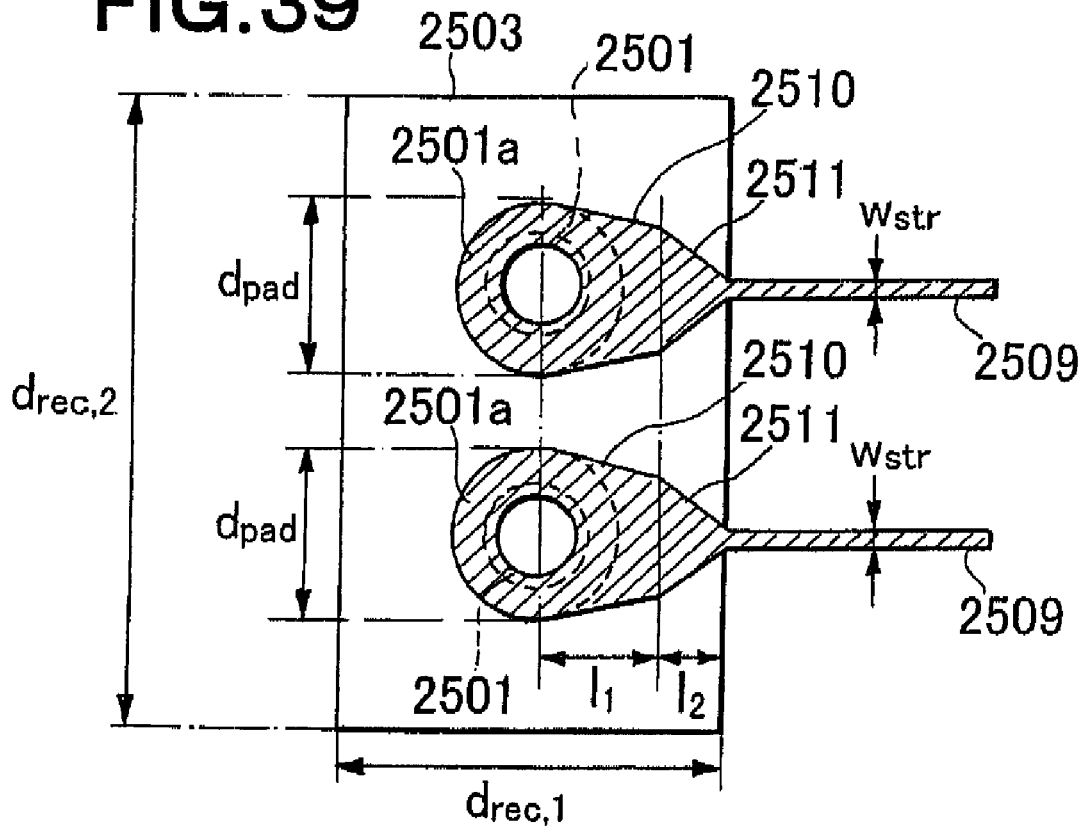
FIG. 39 is a plan view at a conductor layer of broadband transitions from a differential via pair to differential planar transmission lines with symmetrical arrangement of strips.

One of important via structures in a multilayer substrate is signal via pair which can be used for differential signaling. Differential signal propagation demonstrates completely different electromagnetic behavior if it is compared with single-ended signaling. In particular, differential signaling can significantly eliminate noise from ground system and reduce radiating emission. Thus, it is important to provide broadband operation of interconnections including differential vias and planar transmission lines in a multilayer PCB. In FIG. 39, a broadband connection of via pair placed in the center of a rectangular clearance hole and differential transmission line is demonstrated. This connection is made as two transitions. Each transition consisting of two linear tapers has total length l1+l2 which is equal to the characteristic dimension of the clearance hole drec, ½ in the direction of the transmission line. Note in this figure, a symmetrical arrangement of differential strips relatively to the central via axis is shown.

Figure 40:
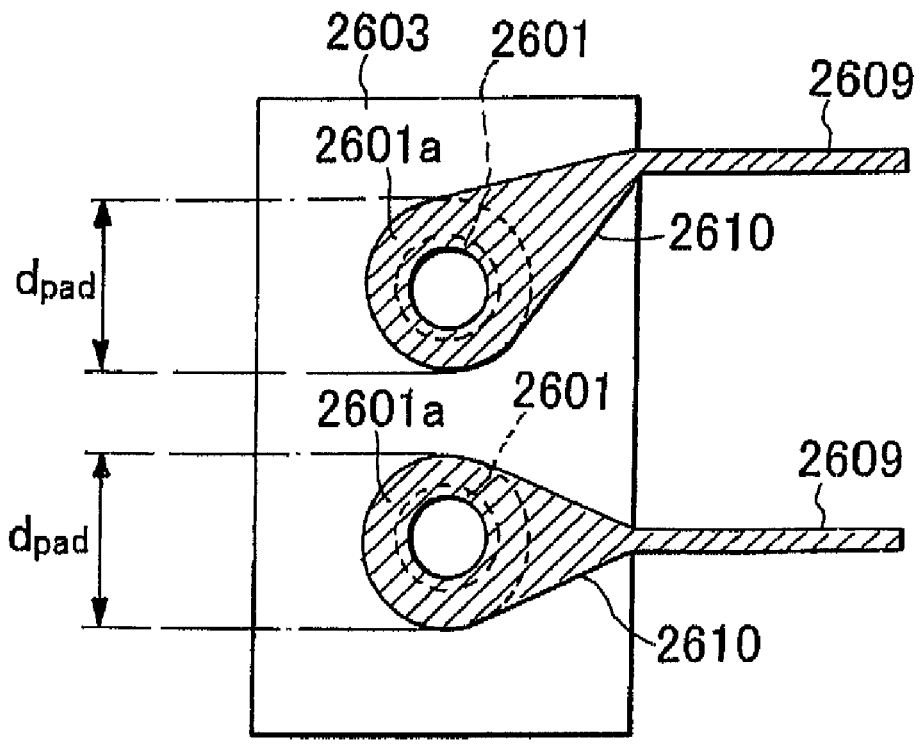
FIG. 40 is a plan view at a conductor layer of broadband transitions from a differential via pair to differential planar transmission lines with symmetrical arrangement of strips.

It is clear that presented compensating technique can be applied to an asymmetrical arrangement the differential stripline pair relatively the central via axis. In FIG. 40, the linear tapers, formed for this case of differential interconnections, are presented.

It should be noted that multilayer substrates include any structures consisting of a number of planar conductor layers, which are separated by an isolating material (as for example, a dielectric). As for example, multilayer PCBs, multilayer packaging and other interconnected technologies can be related to these structures.

The invention claimed is:

1. A broadband transition structure for a connection of a via structure to a planar transmission line in a multilayer substrate, said via structure comprising a signal via, comprising:
   a signal via pad serving for connection of said signal via and said planar transmission line; and
   a compensating part connected to said signal via pad and said planar transmission line serving for compensation of an excess inductive reactance of a part of said transmission line situated in an area of a clearance hole by means of appropriate choice of form and dimensions of said compensation part,
   wherein said compensating part has a form of a taper in which transverse dimensions of said taper are equal to a diameter of said signal via pad at one end and a signal strip width of said planar transmission line at the other end.

2. The broadband transition structure according to claim 1, wherein a length of said taper is equal to a radius of said clearance hole in a direction of said planar transmission line.

3. The broadband transition structure according to claim 1, wherein a length of said taper is longer than a radius of said clearance hole in a direction of said planar transmission line and said length is defined as providing the characteristic impedance of the said transition structure within a predetermined value.

4. The broadband transition structure according to claim 1, wherein a length of said taper is equal to a sum of a radius of said clearance hole in a direction of said planar transmission line and surplus providing an additional compensation of said excess inductive reactance by means of an excess capacitance reactance of a part of said taper formed in said planar transmission line, said surplus being connected to said taper formed in an area of said clearance hole at one end and to said planar transmission line at the other end.

5. The broadband transition structure according to claim 1, wherein a center line of said taper is parallel with a center line of said planar transmission line.

6. The broadband transition structure according to claim 1, wherein a center line of the taper is oblique with respect to a center line of said planar transmission line.

7. The broadband transition structure according to claim 1, wherein said compensating part comprises a number of tapers which have a form and dimensions providing compensation of said excess inductive reactance of the part of a signal strip in the area of said clearance hole.

8. The broadband transition structure according to claim 1, wherein said compensating part has a first portion, width of which increases as approaching said planar transmission line, and a second portion, width of which decreases as approaching said planar transmission line.

9. The broadband transition structure according to claim 1, wherein said compensating part has a first portion, width of which is constant, and a second portion, width of which decreases as approaching said planar transmission line.

10. The broadband transition structure according to claim 1, wherein said via structure further comprises ground vias.

11. The broadband transition structure according to claim 1, wherein a plurality of sets of said signal via, said signal via pad, said compensation part and said planar transmission line are provided.

12. The broadband transition structure according to claim 1,
   wherein said compensating part is connected to said signal via pad at one end and by a non-step passage to said planar transmission line at another end, and
   wherein said compensating part has appropriate form and dimensions as those to compensate an excess inductive reactance of a part of said transmission line situated in an area of a clearance hole serving for isolation of said signal via from other conductive parts of said multilayer substrate.

13. The broadband transition structure according to claim 1, wherein said compensating part provides the characteristic impedance of said transition structure within a predetermined value.

14. The broadband transition structure according to claim 1, wherein said compensating part comprises two tapers which have a form and dimensions providing compensation of said excess inductive reactance of the part of signal strip in the area of said clearance hole.

15. The broadband transition structure according to claim 14, wherein a total length of two tapers is equal to a radius of said clearance hole in a direction of said planar transmission line.

* * * * *